United States Patent
Böhm et al.

(10) Patent No.: US 12,198,907 B2
(45) Date of Patent: Jan. 14, 2025

(54) SYSTEM FOR ELECTRICALLY DECOUPLED, HOMOGENEOUS TEMPERATURE CONTROL OF AN ELECTRODE BY MEANS OF HEAT CONDUCTION TUBES, AND PROCESSING FACILITY COMPRISING SUCH A SYSTEM

(71) Applicant: MEYER BURGER (GERMANY) GMBH, Hohenstein-Ernstthal (DE)

(72) Inventors: Christian Böhm, Hohenstein-Ernstthal (DE); Sebastian Raschke, Thalheim (DE)

(73) Assignee: MEYER BURGER (GERMANY) GMBH, Hohenstein-Ernstthal (DE)

( * ) Notice: Subject to any disclaimer, the term of this patent is extended or adjusted under 35 U.S.C. 154(b) by 558 days.

(21) Appl. No.: 16/956,387

(22) PCT Filed: Dec. 19, 2018

(86) PCT No.: PCT/EP2018/085820
§ 371 (c)(1),
(2) Date: Jun. 19, 2020

(87) PCT Pub. No.: WO2019/121899
PCT Pub. Date: Jun. 27, 2019

(65) Prior Publication Data
US 2021/0090863 A1    Mar. 25, 2021

(30) Foreign Application Priority Data

Dec. 21, 2017 (DE) ............ 10 2017 223 592.6

(51) Int. Cl.
*H01J 37/32* (2006.01)
*H01L 23/427* (2006.01)

(52) U.S. Cl.
CPC .. *H01J 37/32724* (2013.01); *H01J 37/32522* (2013.01); *H01L 23/427* (2013.01)

(58) Field of Classification Search
CPC ... C23C 16/4586; C23C 16/46; C23C 16/481; H01J 37/32522; H01J 37/32715;
(Continued)

(56) References Cited

U.S. PATENT DOCUMENTS

| | | | | |
|---|---|---|---|---|
| 4,315,131 A | * | 2/1982 | Townend | .......... H01J 37/32697 219/121.12 |
| 4,381,965 A | * | 5/1983 | Maher, Jr. | ......... H01J 37/32568 156/345.47 |

(Continued)

FOREIGN PATENT DOCUMENTS

| | | |
|---|---|---|
| CN | 2789934 Y | 6/2006 |
| CN | 102197713 A | 9/2011 |

(Continued)

OTHER PUBLICATIONS

International Search Report (and English translation) and Written Opinion of the International Searching Authority for International Application No. PCT/EP2018/085820 mailed on Mar. 14, 2019.

*Primary Examiner* — Benjamin Kendall
(74) *Attorney, Agent, or Firm* — Heslin Rothenberg Farley & Mesiti P.C.; Jacquelyn A. Graff, Esq.

(57) ABSTRACT

The invention relates to a system for temperature control of an electrode. The system comprises at least one heat pipe, a coupling element and a temperature control apparatus. In this case, the heat pipe is suitable for being arranged in the electrode at least in part and by means of at least one first end. The coupling element is suitable for heating or cooling a second end of the heat pipe, while the temperature control apparatus is suitable for heating or cooling the coupling element. In this case, the electrode and the temperature control apparatus are galvanically separated from one (Continued)

Figure 1A:
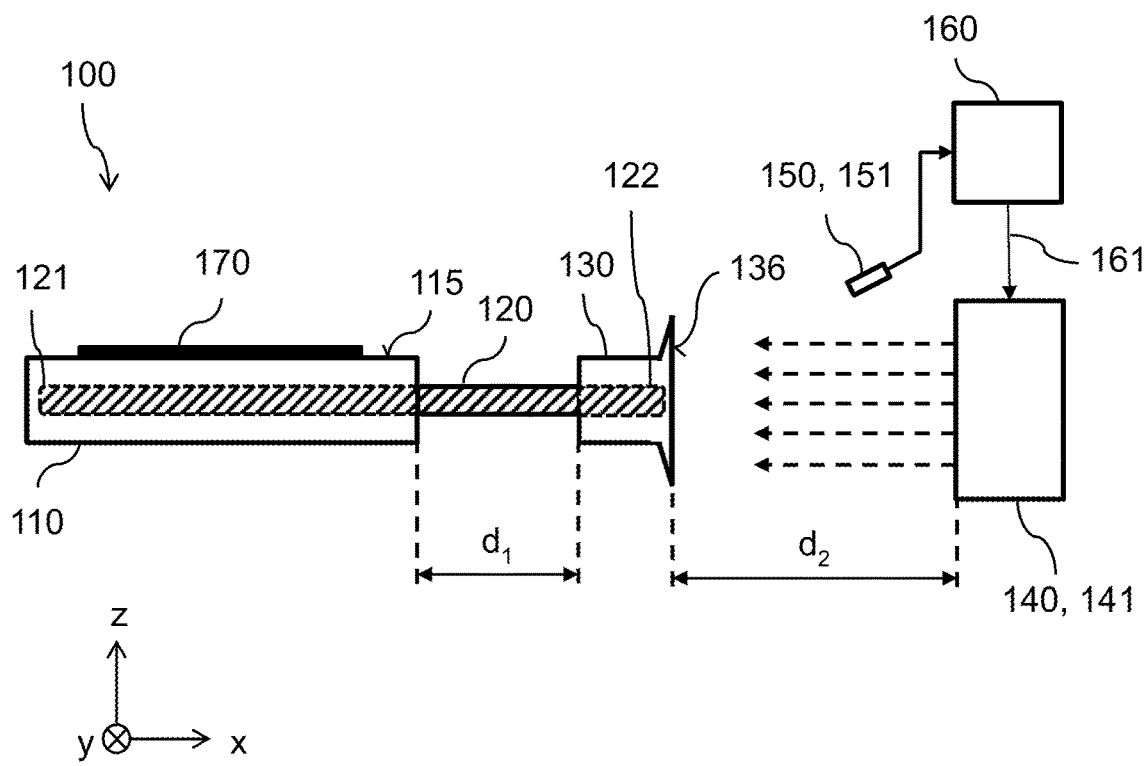

another. The invention further relates to a treatment facility comprising a treatment chamber and at least one electrode inside the treatment chamber and at least one system of this kind for temperature control of an electrode.

19 Claims, 11 Drawing Sheets

(58) Field of Classification Search
CPC ......... H01J 37/32724; H01L 21/67103; H01L 21/67115; H01L 21/67303; H01L 21/67309; H01L 21/6732; H01L 21/68785; H01L 23/427
See application file for complete search history.

(56) References Cited

U.S. PATENT DOCUMENTS

| | | | |
|---|---|---|---|
| 5,231,291 A * | 7/1993 | Amemiya | H01L 21/67109 250/442.11 |
| 5,852,275 A | 12/1998 | Signer | |
| 6,027,701 A | 2/2000 | Ishioka et al. | |
| 2004/0256094 A1 * | 12/2004 | Lee | F28D 15/0266 165/299 |
| 2006/0048363 A1 * | 3/2006 | Sogard | H01L 21/682 248/424 |
| 2006/0144584 A1 * | 7/2006 | Ueda | F28D 15/0266 165/96 |
| 2009/0081878 A1 | 3/2009 | Dhindsa | |
| 2010/0032146 A1 * | 2/2010 | Hartung | F28F 9/0263 165/172 |
| 2010/0307686 A1 * | 12/2010 | Lizuka | H01L 21/67103 118/724 |
| 2013/0146258 A1 * | 6/2013 | Uno | H01L 21/324 165/104.23 |
| 2014/0103806 A1 | 4/2014 | Kellogg et al. | |
| 2014/0356985 A1 * | 12/2014 | Ricci | C23C 16/4586 118/712 |
| 2018/0096912 A1 * | 4/2018 | de Sousa | H05K 1/0272 |

FOREIGN PATENT DOCUMENTS

| | | |
|---|---|---|
| DE | 202010004109 U1 | 10/2011 |
| DE | 102015113962 A1 | 3/2017 |
| EP | 1612853 A1 | 1/2006 |
| EP | 2481831 A1 | 8/2012 |
| JP | S62025411 A | 2/1987 |
| JP | H09092707 A | 4/1997 |
| JP | H09315803 A | 12/1997 |
| JP | 2003045859 A | 2/2003 |
| JP | 2003100835 A | 4/2003 |
| JP | 2005228972 A | 8/2005 |
| JP | 2009170721 A | 7/2009 |
| JP | 2011192532 A | 9/2011 |
| JP | 2012519239 A | 8/2012 |
| JP | H06061184 A | 1/2017 |
| KR | 20020082580 | 10/2002 |
| KR | 20100131354 | 12/2010 |
| KR | 20130032915 | 4/2013 |
| KR | 20160042429 | 4/2016 |
| WO | 95/16804 A1 | 6/1995 |

* cited by examiner

SYSTEM FOR ELECTRICALLY DECOUPLED, HOMOGENEOUS TEMPERATURE CONTROL OF AN ELECTRODE BY MEANS OF HEAT CONDUCTION TUBES, AND PROCESSING FACILITY COMPRISING SUCH A SYSTEM

CROSS REFERENCE TO RELATED APPLICATIONS

This application is a national stage filing under section 371 of International Application No. PCT/EP2018/085820 filed on Dec. 19, 2018, and published on Jun. 27, 2019 as WO 2019/121899, which claims priority to German Application No. 10 2017 223 592.6, filed on Dec. 21, 2017. The entire contents of WO 2019/121899 are hereby incorporated herein by reference.

The invention relates to a system for temperature control of one or more electrodes. In this case, the temperature control of the electrode(s) is achieved by means of heat pipes, as a result of which uniform temperature control and electrical decoupling of the electrode(s) from a temperature control apparatus is made possible. The invention furthermore relates to a treatment facility comprising a system of this kind.

Treatment processes in which energy is introduced via an electrode are used in numerous methods in semiconductor technology such as in solar cell manufacture, and in surface technology such as coating optical glass. In particular plasma processes for applying, removing or modifying layers are examples thereof. In this case, the electrodes used may also function as a substrate retainer or gas supply means. An electrode that is used is often intended to be kept at a specific temperature, for example in order to bring one or more substrates to a temperature that is suitable for the intended process or to keep said substrate at said temperature or in order to prevent the electrode from becoming too hot.

In order to achieve uniform temperature control of an electrode of this kind, fluid systems or resistive heaters are conventionally used as the temperature control apparatus. In the case of a fluid system, a fluid, for example oil, water or gas, flows through the electrode, the fluid being supplied from outside and being discharged to the outside again. Resistive heaters are arranged on or in the electrode, either as planar elements or as straight or spiral filaments, electrical energy being supplied to the heater from the outside, irrespective of the electrode power. In both cases, however, a portion of the electrode power is dissipated to the outside, via the temperature control apparatus, with the result that the power available for the actual treatment process is reduced and components of the temperature control apparatus itself may also be impaired. Therefore, elaborate insulation or filter circuits are often necessary in order to electrically decouple the temperature control apparatus from the electrode. This is significant in particular for high-frequency electrodes, i.e. at electrode powers having a frequency in the range of from 10 kHz to 100 MHz.

Furthermore, a fluid system also has further disadvantages, in particular if oil is used as the fluid. The temperature of the electrode or of a substrate retainer than can be achieved using oil heating is therefore limited, for example to approximately 350° C. Moreover, owing to the heat emission from the fluid while said fluid flows through the electrode or the substrate retainer, a temperature difference of several kelvin arises between the fluid entry location and the fluid outlet location into and out of the electrode, as a result of which uniform temperature control of the electrode is not possible. Finally, but not least, fluid systems, in particular in oil-based temperature control apparatuses, are associated with the danger of a leak within the processing facility, which is associated with significant outlay for cleaning the facility.

A disadvantage of resistive heaters is that said heaters allow only for heating of the electrode or of the substrate retainer, but not for active cooling.

It is also known in principle to use heat pipes, in particular for cooling elements in coating facilities. For example, WO 95/16804 A1 describes the cooling of a gas sparger plate using a heat pipe that extends perpendicularly to the outflow surface of the gas sparger plate and is surrounded at one end by a cooling jacket through which a coolant flows, which coolant is thus in direct contact with the surface of the heat pipe. EP 2 481 831 A1 also mentions the use of heat pipes for dissipating heat from a high-frequency electrode, while the electrode is heated by means of a heating catalyst, a resistive heater or a heating fluid.

The object of the invention is that of providing an improved system for temperature control of an electrode, in particular a high-frequency electrode, and a treatment facility comprising a system of this kind, good electrical decoupling between a temperature control apparatus and the electrode being ensured and other disadvantages of previous temperature control systems being prevented or reduced.

The object is achieved by a system and by a treatment facility according to the independent claims. Preferred embodiments can be found in the dependent claims.

The system according to the invention for temperature control of an electrode comprises at least one heat pipe, a coupling element and a temperature control apparatus. The heat pipe is suitable for being arranged in the electrode at least in part and by means of at least one first end, while the coupling element is suitable for heating or cooling a second end of the heat pipe. The temperature control apparatus, in turn, is suitable for heating or cooling the coupling element and thus functions as a heat source or heat sink with respect to the electrode. In this case, the electrode and the temperature control apparatus are galvanically separated from one another, such that the temperature control apparatus is electrically decoupled from the electrode. The electrode per se is not necessarily a component of the system according to the invention for temperature control of the electrode, but the electrode and the system for temperature control of the electrode are matched to one another and are suitable for being coupled together. For this purpose, the electrode is at least able to receive at least the first end of the heat pipe in the inside thereof.

Heat pipes are pipes consisting of a casing material which are provided with a specific inner structure, for example capillaries or an inlaid wire mesh. A working medium which fills the volume in part in a fluid state and in part in a vaporous state is located in the closed volume of a heat pipe. In this case, heat is transferred from the heat input location, at which the working medium evaporates, to the heat emission location, at which the working medium recondenses. Owing to the high heat flux density, in the case of relatively small heat input surfaces, for example 5 $cm^2$, high heat flows, for example of 50 W, can thus be transported over relatively large stretches, for example 40 cm, in a very short time, for example within a few seconds, and so as to have a very low temperature gradient over the entire length of the heat pipe of approximately 0.5 K. A wide range of embodiments of heat pipes are known to a person skilled in the art. The casing material may for example be a metal, such as aluminium, copper, nickel-plated copper, stainless steel or alloys of various metals, as well as glass or ceramics or a composite material. In this case, the pipe may have a circular, oval, square or n-gonal or any other cross section, it also being possible for the cross section to be very flat (almost strip-like or planar). Depending on the desired temperature range, for example water, sodium, lithium or mercury can be used as the working media. The number and shape of the heat pipes, as well as the arrangement of the heat pipes when a plurality of heat pipes are used, can be selected according to the amount of heat to be transferred and the geometry of the electrode. In this case, a heat pipe may be formed as a straight rod or may be curved, a plurality of bends, e.g. in a meander shape, or three-dimensional bends, also being possible.

The thermal coupling of the heat pipe to the electrode is achieved by means of heat conduction, the heat pipe being able to be pushed, clamped, screwed, adhesively bonded or soldered into the electrode.

A person skilled in the art will select the materials and the geometry of the at least one heat pipe, the arrangement and the type of fastening thereof within the electrode, in accordance with the constraints present, e.g. process gases, electrode temperature to be achieved, material of the electrode, transmission of an electrode voltage, etc. on the basis of his knowledge. It is thus possible, for example, to use metal heat pipes for supplying an electrode voltage from a voltage supply to the electrode.

The electrode may also consist of different materials or of layer structures of different materials, at least one component of the electrode being electrically conductive, however, in order to achieve a desired distribution of the electrical potential over the electrode. Typical electrode materials are aluminium, graphite, stainless steel or composite materials. The electrode is often a planar body which comprises two opposing surfaces having large lateral dimensions with respect to the spacing of said surfaces. At least one of said surfaces is used to generate an electrical field and/or to retain one or more substrates, and is referred to in the following as the effective surface. Therefore, within the meaning of this application, a substrate retainer to which an electrical voltage is not applied and that is either earthed or floating should also be understood as an electrode. However, the electrode may for example also be a gas sparger or contain a device of this kind. The electrical wiring of the electrode can be achieved using direct current or alternating current of low to high frequencies, the system according to the invention being particularly suitable for temperature control of an electrode to which a high-frequency voltage, for example having a frequency of 13.56 MHz or 40 MHz is applied. The electrode may consist of one piece of or of a plurality of parts, for example of half shells, the individual parts being interconnected by means of riveting, welding, soldering, adhesive bonding, screwing, clamping or other joining techniques. Recesses for receiving the at least one heat pipe are preferably formed in the electrode, in which recesses the heat pipe or heat pipes can be pushed, screwed or inserted. The heat pipe or heat pipes extend such that the longitudinal extension thereof (between the first and the second end of the heat pipe) is in parallel with the effective surface of the electrode at least in part.

The coupling element which is heated or cooled using the temperature control apparatus is used for transferring an amount of heat to or from the at least one heat pipe.

In a first embodiment, the coupling element is at least a portion of the outer surface of the electrode, the second end of the heat pipe adjoining said portion of the outer surface.

In this case, the coupling element consists only of a heat transfer surface which corresponds to the portion of the outer surface of the electrode, the heat transfer surface having an increased thermal absorption coefficient compared with other regions of the electrode. For this purpose, said portion of the outer surface of the electrode may for example be blackened with carbon black, graphite or paint, the surface thereof may be roughened, or the surface thereof may be provided with another high-absorption thin (thickness less than or equal to 50 μm) coating. For example, an aluminium electrode may be anodised onto the outer surface. The outer surface that comprises the coupling element is preferably not an effective surface of the electrode. More preferably, the entire surface of the outer surface forms the coupling element. The first embodiment is particularly suitable for the use of an infrared radiator as the temperature control apparatus, the coupling element having a thermal absorption coefficient (emissivity) in the spectral range of the infrared radiator of more than or equal to 0.5, preferably in the range of 0.7 to 0.9, while the remaining regions of the electrode have an emissivity of approximately 0.2, depending on the degree of coating. The surface of the coupling element is preferably substantially smaller than the effective surface of the electrode and is for example less than 15% of the effective surface and for example less than 10% of the entire electrode surface (upper and lower face and outer faces of the electrode). The thermal coupling of the heat pipe to the coupling element is achieved by means of heat conduction. The heat pipe or heat pipes extend(s) from the coupling element, over the effective surface of the electrode, into the inside of the electrode, such that the heat is distributed evenly over the effective surface of the electrode and the temperature of the effective surface is controlled uniformly, for example having a temperature difference of 0.5 K over the entire extension of the effective surface.

In a second embodiment of the system according to the invention, the coupling element is a body that is separated from the electrode and consists of a material having a high level of thermal conductivity, the coupling element being suitable for being arranged in a region of the outer surface of the electrode that is adjacent to a volume region of the electrode in which at least the second end of the heat pipe can be arranged. That is to say that the heat pipe is arranged completely within the electrode when the system according to the invention is in use, while the coupling element adjoins an outer surface of the electrode in the region in which the second end of the heat pipe is located, and is physically connected to the electrode, for example by means of clamping or screwing, such that good heat conduction exists between the coupling element and the electrode. The coupling element thus transfers heat to the heat pipe or dissipates heat therefrom by means of heat conduction through the electrode material located between said coupling element and the second end of the heat pipe. The coupling element may consist of the same material as the electrode or of a different material and, in the range of the desired electrode temperature, has a thermal conductivity of more than or equal to 20 W/(m·K), preferably more than or equal to 150 W/(m·K), which thermal conductivity is preferably more than or equal to the thermal conductivity of the material of the electrode. When selecting the material for the coupling element, it may be necessary to also take account of the compatibility with respect to process conditions that exist when the electrode is used for a treatment process. The contact surface between the coupling element and the electrode, which surface is the heat input surface into the electrode, is preferably substantially smaller than the effective surface of the electrode and is for example less than 15% of the effective surface and for example less than 10% of the entire electrode surface (upper and lower face, and outer faces of the electrode).

In a third embodiment of the system according to the invention, the coupling element is a body that is separated from the electrode and consists of a material having a high level of thermal conductivity, and in which element at least the second end of the heat pipe is arranged. In this case, the coupling element is preferably not directly physically connected to the electrode, but may be adjacent thereto. This is advantageous if the materials of the coupling element and of the electrode have different thermal expansion coefficients. If said thermal expansion coefficients are the same or approximately the same for the coupling element and the electrode, the coupling element can thus also be physically connected to the electrode, for example by means of screwing or clamping. The coupling element may consist of the same material as the electrode or of a different material and, in the range of the desired electrode temperature, has a thermal conductivity of more than or equal to 20 W/(m·K), preferably more than or equal to 150 W/(m·K), which thermal conductivity is preferably more than or equal to the thermal conductivity of the material of the electrode. When selecting the material for the coupling element, it may be necessary to also take account of the compatibility with respect to process conditions that exist when the electrode is used for a treatment process.

The thermal coupling of the heat pipe to the coupling element is achieved, in the third embodiment, by means of heat conduction, it being possible for the heat pipe to be pushed, clamped, screwed, adhesively bonded or soldered into the coupling element. The coupling element may, similarly to the electrode, consist of one piece of or of a plurality of parts, for example of half shells, the individual parts being interconnected by means of riveting, welding, soldering, adhesive bonding, screwing, clamping or other joining techniques. Recesses for receiving the at least one heat pipe are preferably formed in the coupling element, in which recesses the heat pipe or heat pipes can be pushed, screwed or inserted.

In a specific configuration of the second or third embodiment, the coupling element consists of an electrically conductive material, for example aluminium, copper, nickel-plated copper or graphite. If, in this embodiment, the coupling element adjoins the electrode or the heat pipe comprises an electrically conductive casing material, the coupling element is at the same electrical potential as the electrode. Furthermore, an electrode voltage can then also be applied to the electrode by means of the coupling element and/or the heat pipe.

In another specific configuration of the second or third embodiment, the coupling element consists of an electrically insulating material, such as a ceramic oxide, e.g. $Al_2O_3$, or a non-oxide ceramic, e.g. aluminium nitride.

The coupling element of the second or third embodiment of the system according to the invention preferably comprises a heat transfer surface that is an outer surface of the coupling element and via which the coupling element interacts with the temperature control apparatus. An "outer surface of the coupling element" is also understood to be a surface of a hole introduced into the coupling element, the temperature control apparatus being arranged inside the hole at least in part. The heat transfer surface has an increased thermal absorption coefficient or an increased thermal conductivity compared with other regions of the coupling element. To this end, the heat transfer surface may be blackened, roughened or provided with a high-absorption thin coating, as has already been described with reference to the coupling element of the first embodiment. The thermal absorption coefficient in the wavelength range of the temperature control apparatus is preferably greater than or equal to 0.5, preferably in the range of from 0.7 to 0.9. If heat is transmitted between the temperature control apparatus and the coupling element by means of heat conduction, the heat transfer surface may thus also be provided with a coating that has particularly high thermal conductivity, e.g. with a layer of graphene, copper, silver or gold. The heat transfer surface preferably has a thermal conductivity of more than or equal to 150 W/(m·K). In order to achieve particularly good thermal coupling to the temperature control apparatus, the heat transfer surface is preferably an enlarged surface. That is to say that the heat transfer surface for example has a greater height or width than the opposite outer surface of the coupling element. However, the heat transfer surface of the coupling element is preferably substantially smaller than the effective surface of the electrode and is for example less than 15% of the effective surface and for example less than 10% of the entire electrode surface (upper and lower face and outer faces of the electrode).

The temperature control apparatus is preferably an infrared radiator which transfers heat to the coupling element by means of thermal radiation, or an inductor which induces eddy currents in the material of the coupling element using an alternating magnetic field. In both cases, the temperature control apparatus can be spaced apart from the coupling element, such that there is no direct or galvanic electrical coupling between the temperature control apparatus and the electrode, even in the case of an electrically conductive coupling element or in the case of an electrically conductive coupling element and an electrically conductive heat pipe. In the event of an infrared radiator being used as the temperature control apparatus, a material that is permeable to the infrared rays but is electrically insulating, for example silica glass, may be arranged between the infrared radiator and the coupling element, and may ensure electrical decoupling between the temperature control apparatus and the electrode.

In order to achieve cooling of the coupling element by means of thermal radiation, the temperature control apparatus may also be an intensively cooled heat sink. It is thus possible, for example, for a graphite surface to be arranged opposite the heat transfer surface of the coupling element and to be cooled, and to thus function as a radiation sink for the coupling element.

In other preferred embodiments, the temperature control apparatus is a resistive heater or a fluid-based apparatus that transfers heat to the coupling element or, in the case of a fluid-based apparatus, dissipates heat therefrom, by means of heat conduction. If the coupling element or, in the case of a coupling element that is spaced apart from the electrode, at least the heat pipe consists of an electrically insulating material, the temperature control apparatus can thus directly adjoin the coupling element. If the coupling element and the heat pipe consist of an electrically conductive material, a further electrical insulator is thus arranged between the temperature control apparatus and the heat transfer surface of the coupling element. In this embodiment, although the temperature control apparatus and the electrode are not fully electrically decoupled from one another, the electrical losses are reduced and easy to calculate, and can thus be more easily taken into account in the electrode voltage supply.

In a further embodiment, the system furthermore comprises a temperature measurement unit and a control unit, the temperature measurement unit being suitable for determining a parameter that is associated with the temperature of the coupling element, and the control unit being suitable for controlling the temperature control apparatus. In this case, the temperature measurement unit may contain a thermocouple which is arranged directly on the coupling element. In the case of a coupling element consisting of an electrically conductive material, the thermocouple is preferably electrically decoupled from the coupling element. In another variant, the temperature measurement unit may contain a pyrometer or fibre-optical sensors. The control unit controls the temperature control apparatus according to the actual temperature of the coupling element, determined using the temperature measurement unit, and a specified target temperature of the coupling element The treatment facility according to the invention comprises a treatment chamber and at least one electrode inside the treatment chamber, and at least one system according to the invention for temperature control of an electrode. If the treatment chamber contains more than one electrode, each electrode is preferably associated with one individual system, respectively, for temperature control of the electrode. That is to say that at least one heat pipe and the coupling unit of each system for temperature control of an electrode are associated with precisely one electrode, it being possible, however, for one temperature control apparatus to be used for temperature control of a plurality of electrodes or coupling elements at the same time. Alternatively, it is also possible for heat pipes which are each connected to one electrode, but a different electrode in each case, to be connected to just one coupling element, and thus for one coupling element to be associated with a plurality of electrodes. The treatment facility is preferably suitable for creating a vacuum inside the treatment chamber, and has corresponding apparatuses and properties therefor.

The temperature control apparatus of at least one first system for temperature control of an electrode is preferably arranged outside the treatment chamber. Alternatively, however, the temperature control apparatus can also be arranged inside the treatment chamber. It is thus possible, for example, for an infrared radiator, which is arranged inside a cladding tube, for example consisting of silica glass, to be arranged inside the treatment chamber. The advantage of this variant is that the cladding tube is sealed off from an atmosphere inside the treatment chamber, e.g. a vacuum, and thus a specified gas composition prevails in the inside of the cladding tube, at atmospheric pressure. As a result, there are no restrictions for the operating voltage of the infrared radiator.

In a preferred embodiment, the temperature control apparatus of a first system for temperature control of an electrode is arranged outside the treatment chamber, and the coupling element of the first system is arranged entirely inside the treatment chamber. In this case, the temperature control apparatus is preferably an infrared radiator and the treatment chamber comprises a radiation window through which the infrared radiation can reach the coupling element from the temperature control apparatus. Alternatively, the temperature control apparatus is an inductor, the treatment chamber being able to be adapted to the alternating magnetic field. In this case, the electrical decoupling between the temperature control apparatus and the electrode is advantageously achieved by means of the spacing between the temperature control apparatus and the coupling element, and the air located between or optionally the vacuum located between which function as a dielectric medium.

Of course, the coupling element of the first system, the temperature control apparatus of which is arranged outside the treatment chamber, may also be arranged outside the treatment chamber completely or in part. Corresponding feedthroughs through a wall of the treatment chamber are known to a person skilled in the art.

The treatment facility preferably comprises a plurality of electrodes and a plurality of systems for temperature control of an electrode, the coupling elements of at least two systems for temperature control of an electrode being interconnected by means of at least one additional heat pipe. As a result, temperature differences between the individual coupling elements can be balanced and a particularly uniform temperature distribution over all the electrodes, the associated coupling elements of which are interconnected via the additional heat pipe, can be achieved. Alternatively, it is of course also possible for different temperatures to be set for different electrodes, the coupling elements of said electrodes then not being interconnected via an additional heat pipe.

The treatment facility preferably comprises a plurality of electrodes and a plurality of systems for temperature control of an electrode, the effective surfaces of the electrodes in each case being arranged so as to be mutually parallel and mutually opposing. This corresponds to a stack of electrodes, it being possible in this case for the electrodes to be arranged vertically above one another, or horizontally side-by-side, or side-by-side in any other spatial direction. In this case, adjacent electrodes are thus connected to one or more voltage supplies, such that different electrode voltages can be applied to said electrodes. As a result, adjacent electrodes in each case form a (plate) capacitor in which for example a plasma is ignited or another form of treatment can be carried out. In this case, electrodes having a first electrode voltage and electrodes having a second electrode voltage which is different from the first electrode voltage, are preferably arranged alternately in the stack. Each electrode is associated with one individual system for temperature control of the electrode, each coupling element being associated with precisely one electrode. The coupling elements of the systems for temperature control of the electrodes are in each case a body that is separated from the electrode, as has been described above with reference to the second or third embodiment of the system according to the invention. In this case, each coupling element has the same potential, at at least one of the outer surfaces thereof, as the associated electrode. In other words, the electrode and the coupling element are electrically coupled and are at the same potential. In order to reduce the capacitance of the additional (plate) capacitors between the coupling elements and adjacent electrodes, and to thus minimise the risk of ignition of a parasitic plasma, the coupling elements that are associated with neighbouring electrodes are arranged so as to be mutually offset at least in a direction perpendicular to the spacing of the neighbouring electrodes. This means that the coupling elements are either arranged on different sides of the electrodes, preferably on opposing sides of the electrodes, or that the coupling elements which then extend over only a portion of the lateral extension of the electrode are arranged on the same side of the electrodes but in this case are mutually offset along said lateral extension of the electrodes, preferably having one coupling element at the start of the lateral extension of the associated electrode and one coupling element at the end of the lateral extension of the associated electrode, i.e. at different edges of the lateral extension.

In a particular embodiment of the treatment facility, the coupling element of at least one system for temperature control of an electrode is connected to a voltage supply and is suitable, alone or together with the relevant at least one heat pipe, for applying an electrode voltage to the associated electrode. In other words: If the coupling element is electrically conductive and adjoins the electrode, or if the at least one heat pipe is also electrically conductive, the electrode can thus be supplied with electrical power via the coupling element. As a result, a separate voltage feed to the electrodes can be replaced by a voltage feed to the coupling element, which has a positive effect with respect to the space requirement on the electrode and with respect to further properties of the treatment facility. For example, the number of vacuum feedthroughs can be reduced and parasitic plasmas can be avoided, or additional electrical insulation, which is intended to prevent the formation of parasitic plasmas in the case of a separate voltage feed to the electrode(s), can be omitted. If an additional heat pipe is present, this can also be used for supplying the electrode voltage to the coupling element.

The system according to the invention and the treatment facility according to the invention have the following advantages:
- very uniform temperature distribution within the electrode can be achieved (temperature difference of less than or equal to 0.5 K),
- very quick heat transfer, in particular high heating rates of from 2 to 3 K/s are possible,
- no influence on a plasma process in which the electrode is used, because all the materials of the system can be selected so as to be compatible with the process and no additional electromagnetic fields are introduced by the heat pipes,
- prevention or minimisation of electrical losses when an electrical power is applied to the electrode, by means of the at least substantial electrical decoupling of the electrode from the temperature control apparatus,
- protection of the temperature control apparatus from damage due to a high-frequency electrode voltage, by means of the at least substantial electrical decoupling of the electrode from the temperature control apparatus, a filter circuit not being required,
- cost-effective and adaptably tailorable variants for temperature control of the electrode, in which cooling is also possible,
- minimisation of the leak risk by minimising the volume of fluid or gaseous foreign matter in a treatment chamber,
- minimisation of the maintenance outlay for the treatment chamber or the entire treatment facility,
- minimisation of the required number of vacuum feedthroughs, due to multifunctional components (e.g. heat pipe for transferring the amount of heat and for supplying a voltage to the electrode).

The invention will be explained in the following with reference to embodiments and to the drawings. In this case, the dimensions of the individual elements and the relation thereof to one another are not to scale, but are instead reproduced merely schematically. The same reference signs denote corresponding similar components.

Figure 1B:
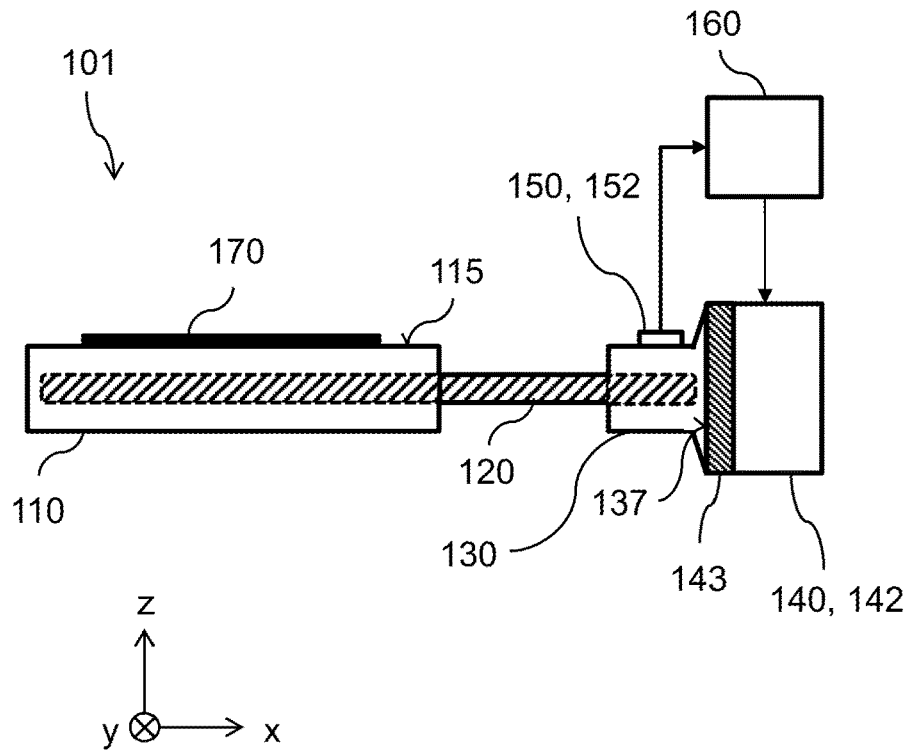
Figure 2:
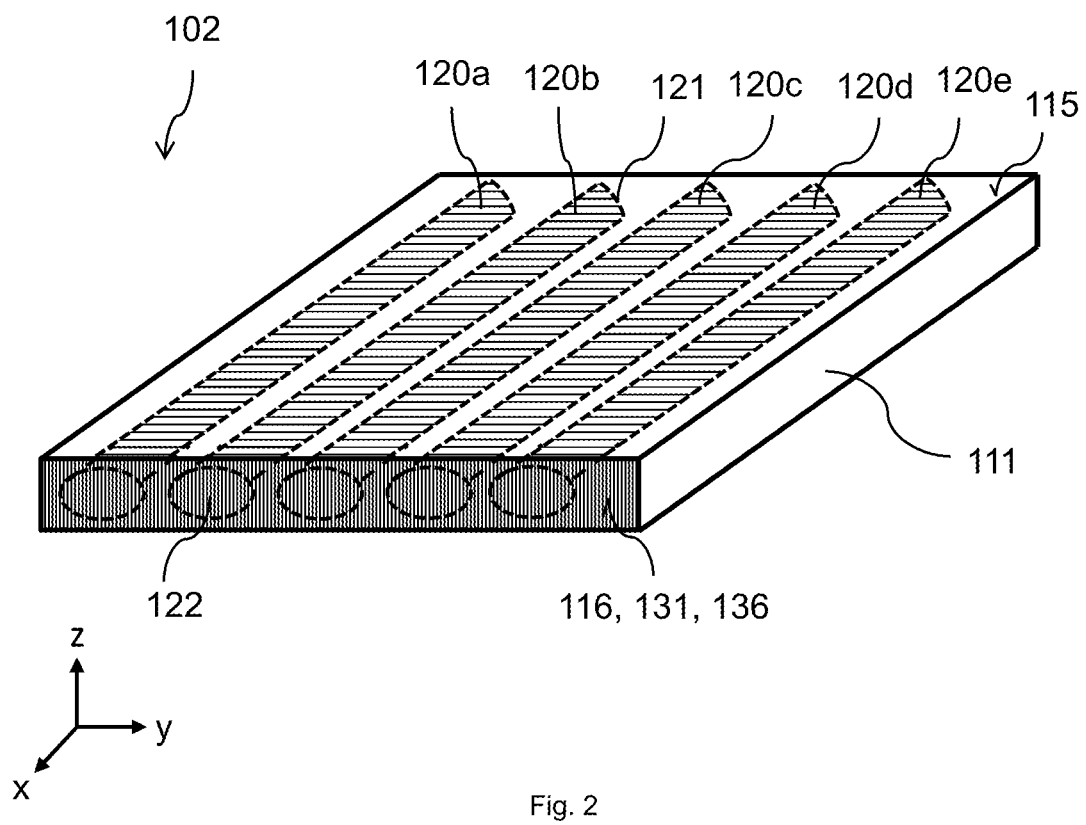
Figure 3A:
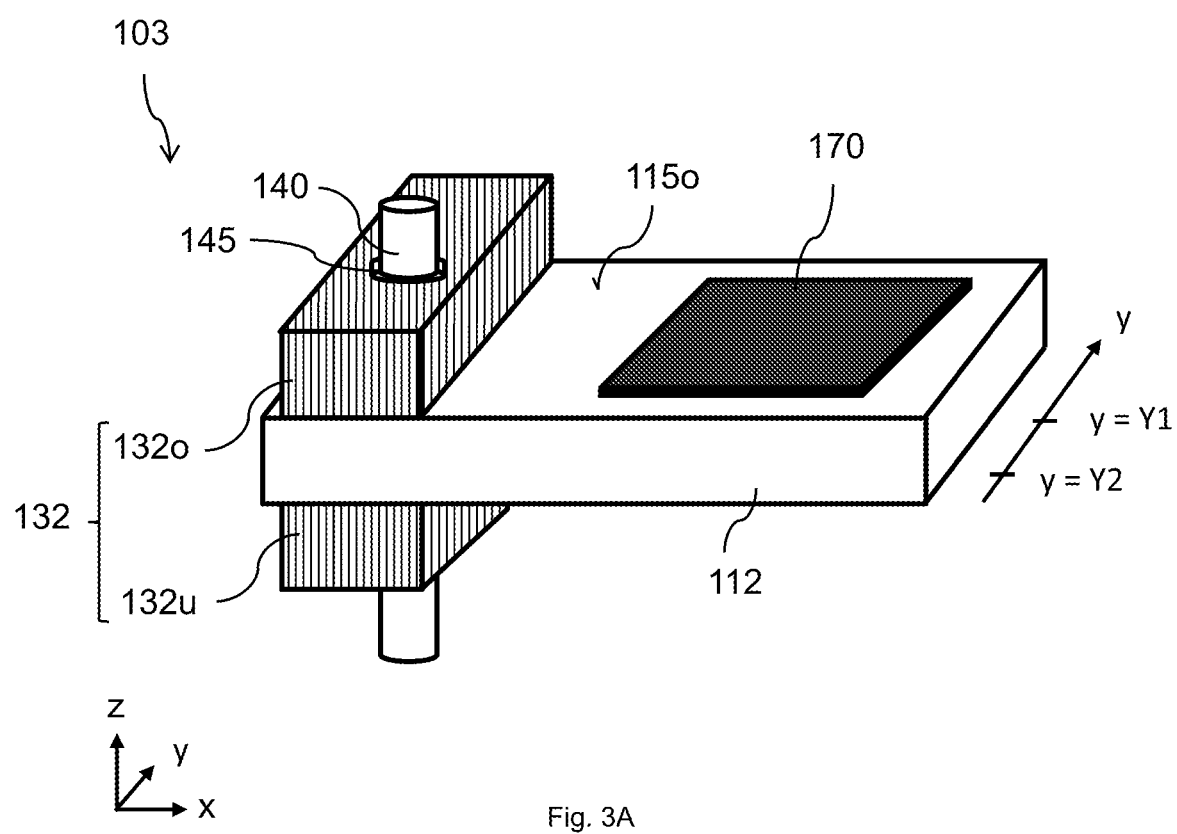
Figure 3B:
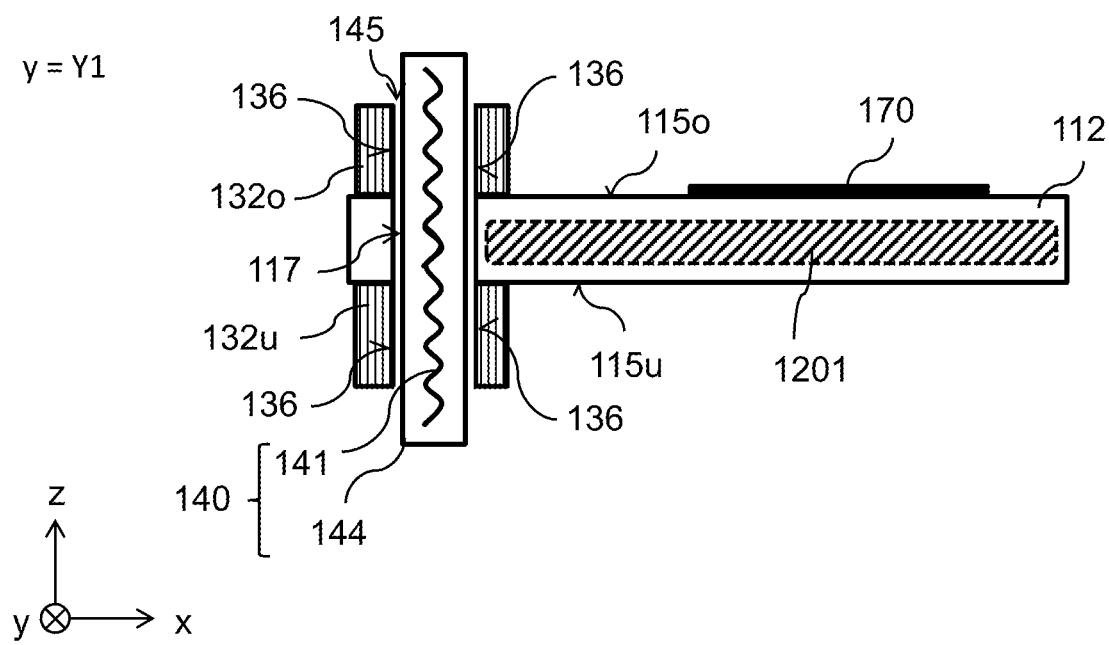
Figure 3C:
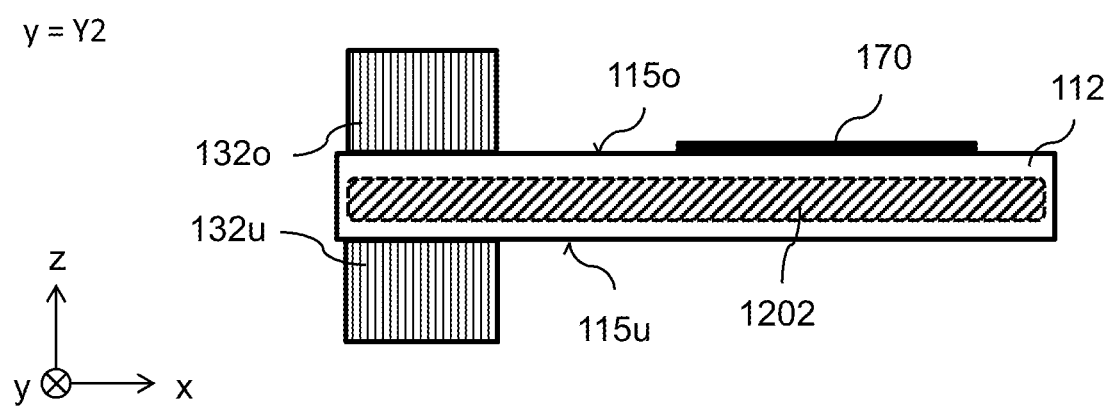
Figure 4:
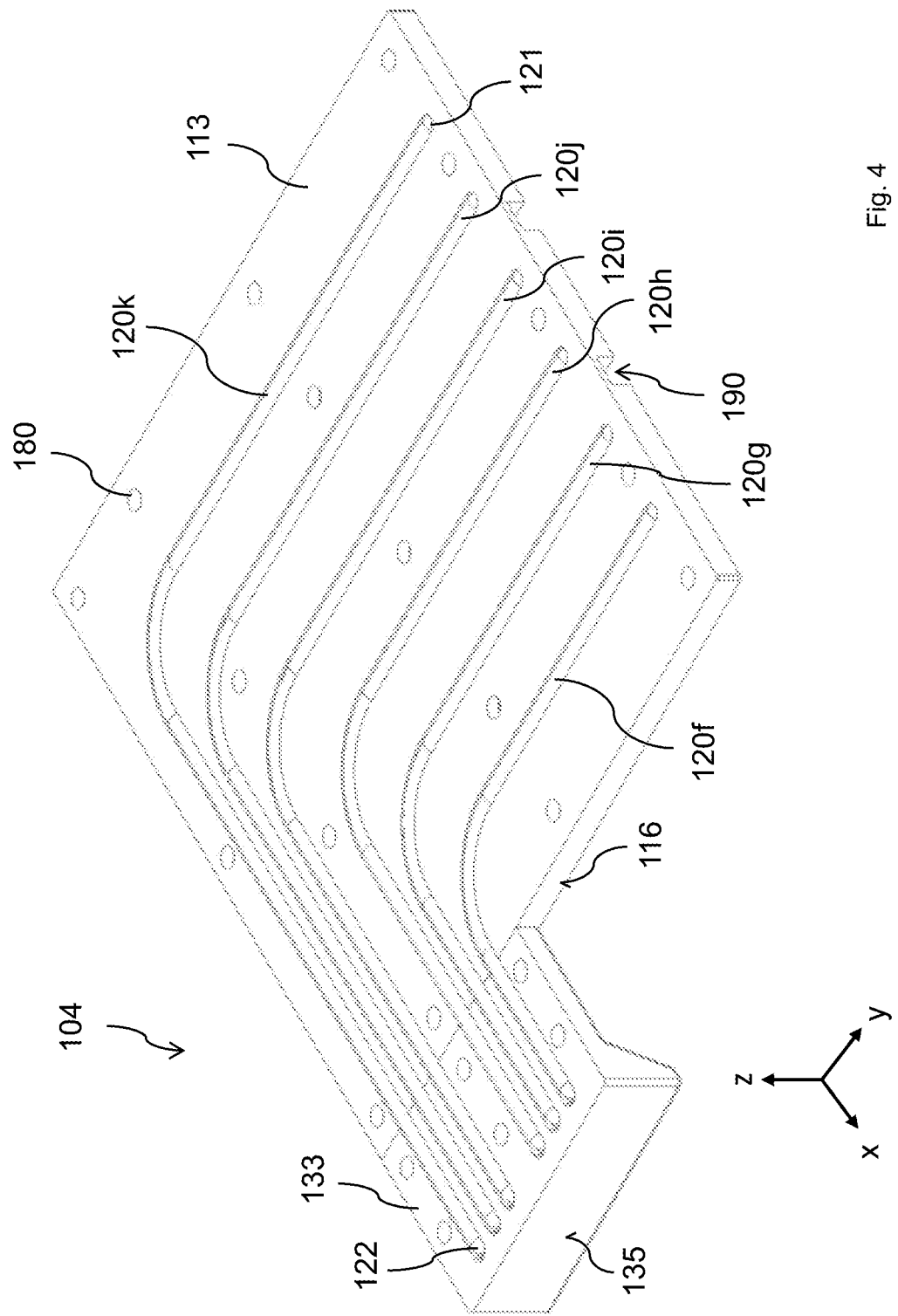
Figure 5A:
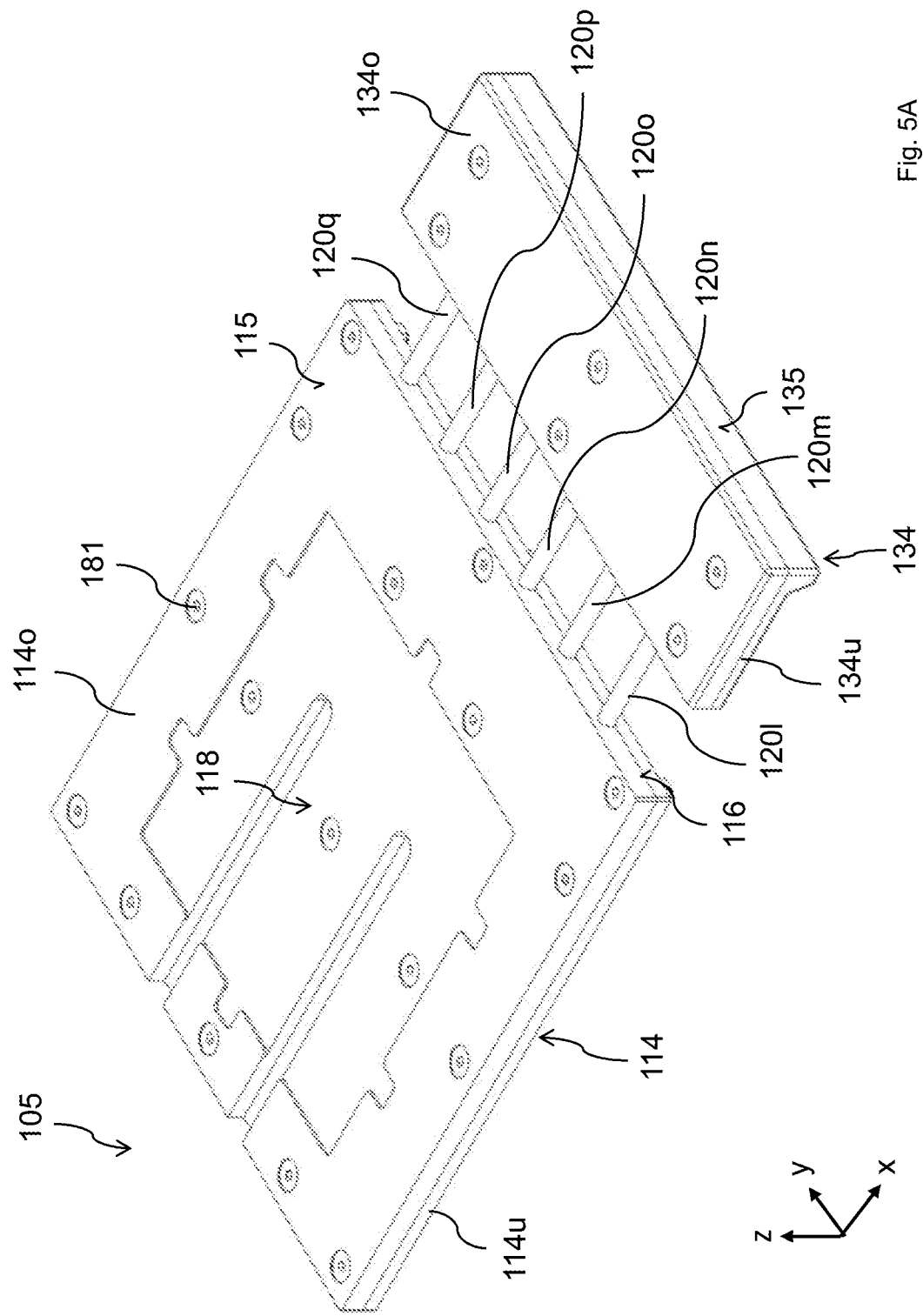
Figure 5B:
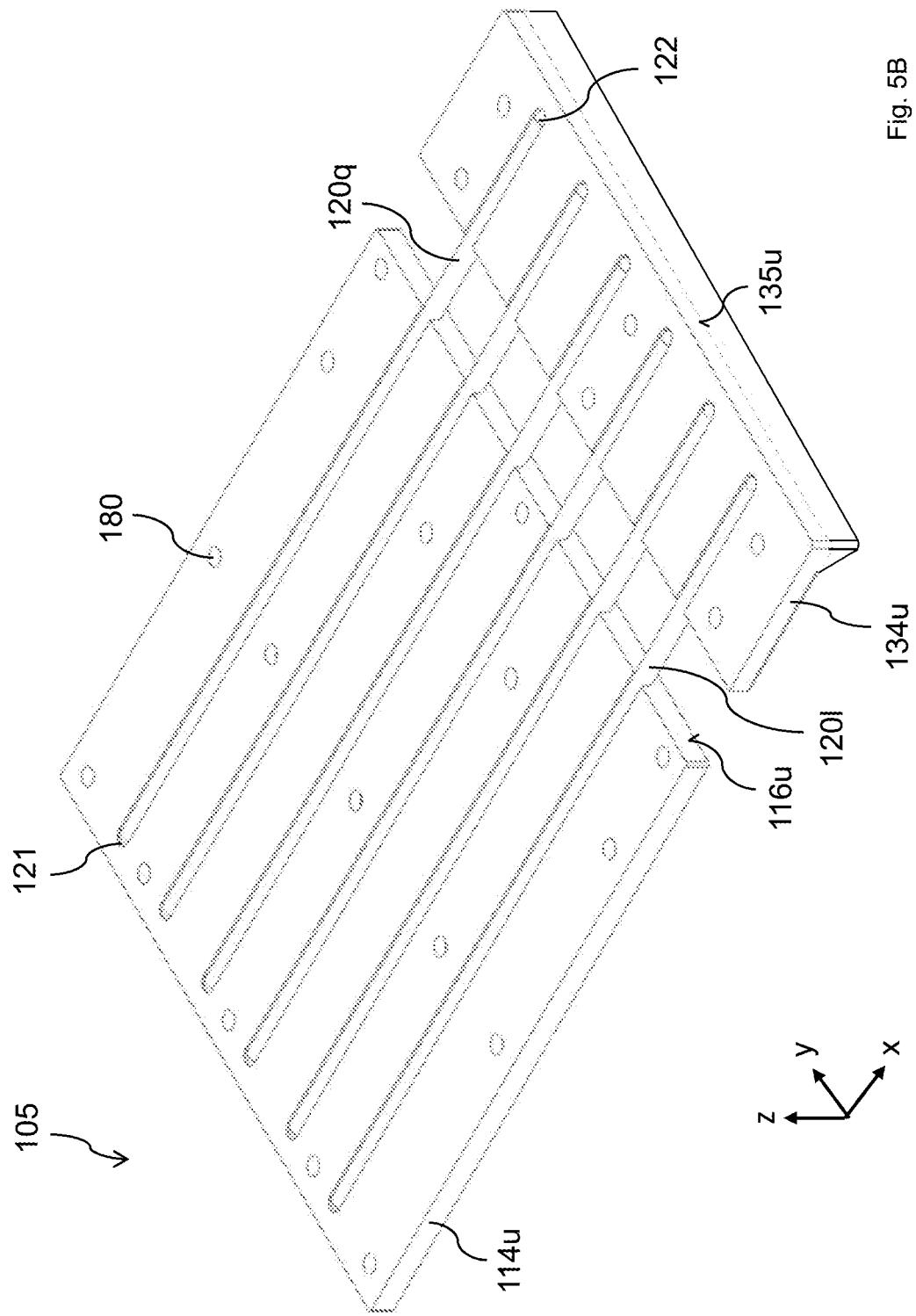
Figure 6A:
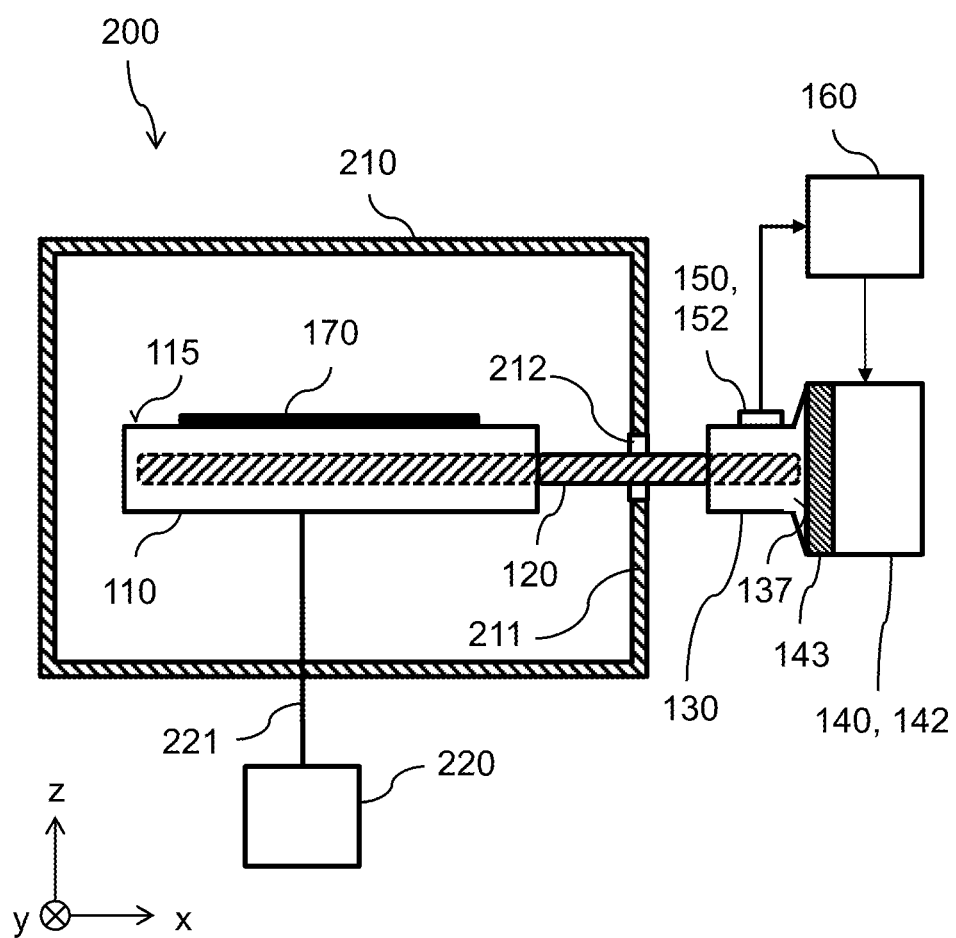
Figure 6B:
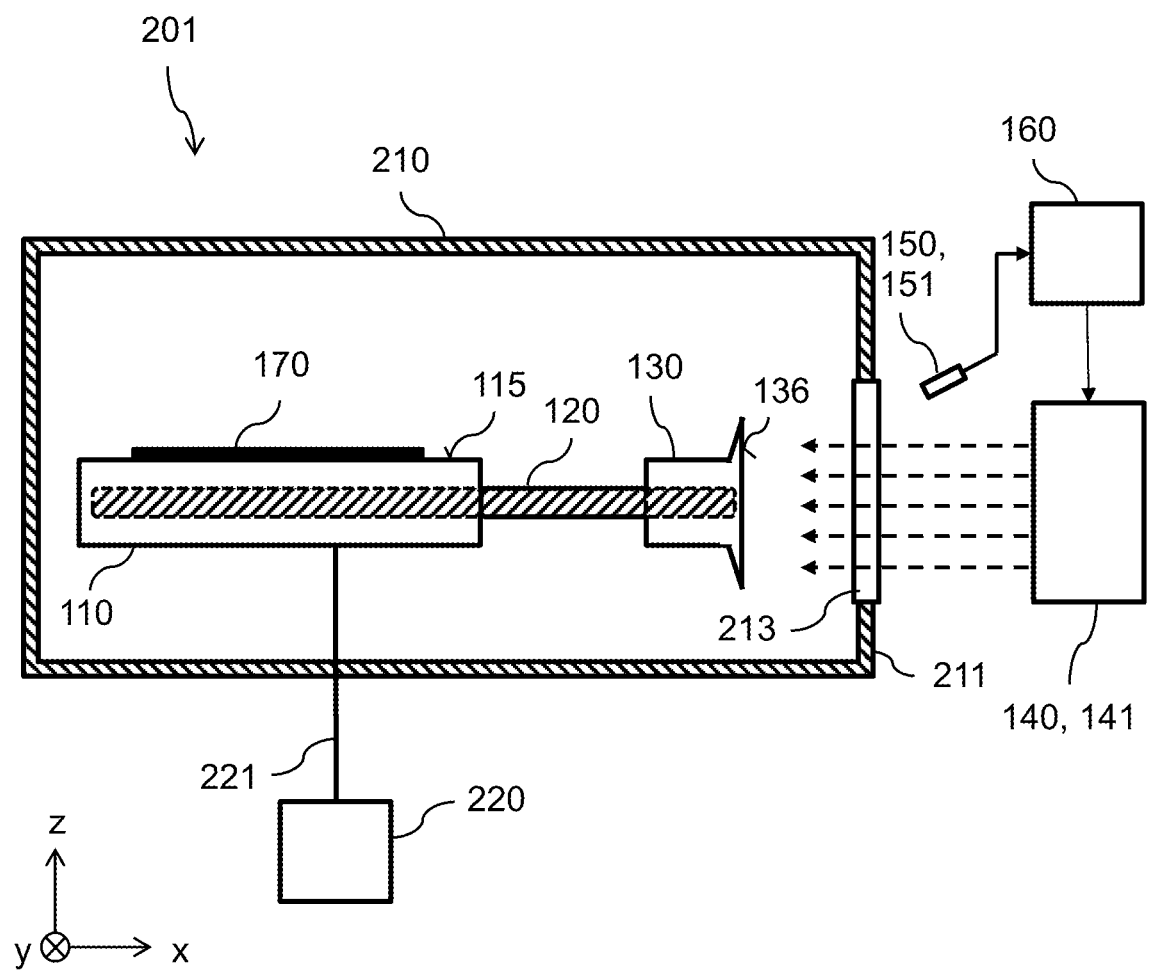
Figure 7:
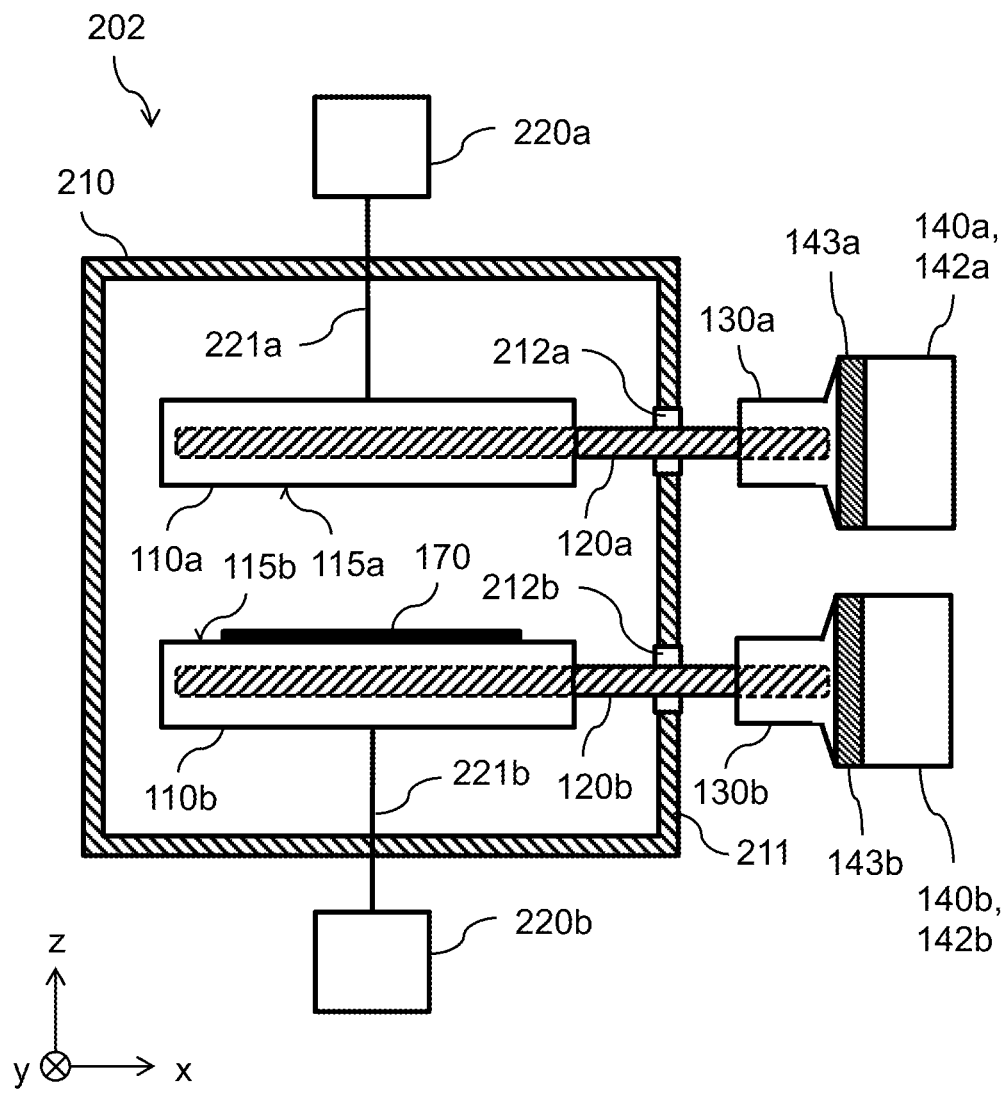
Figure 8:
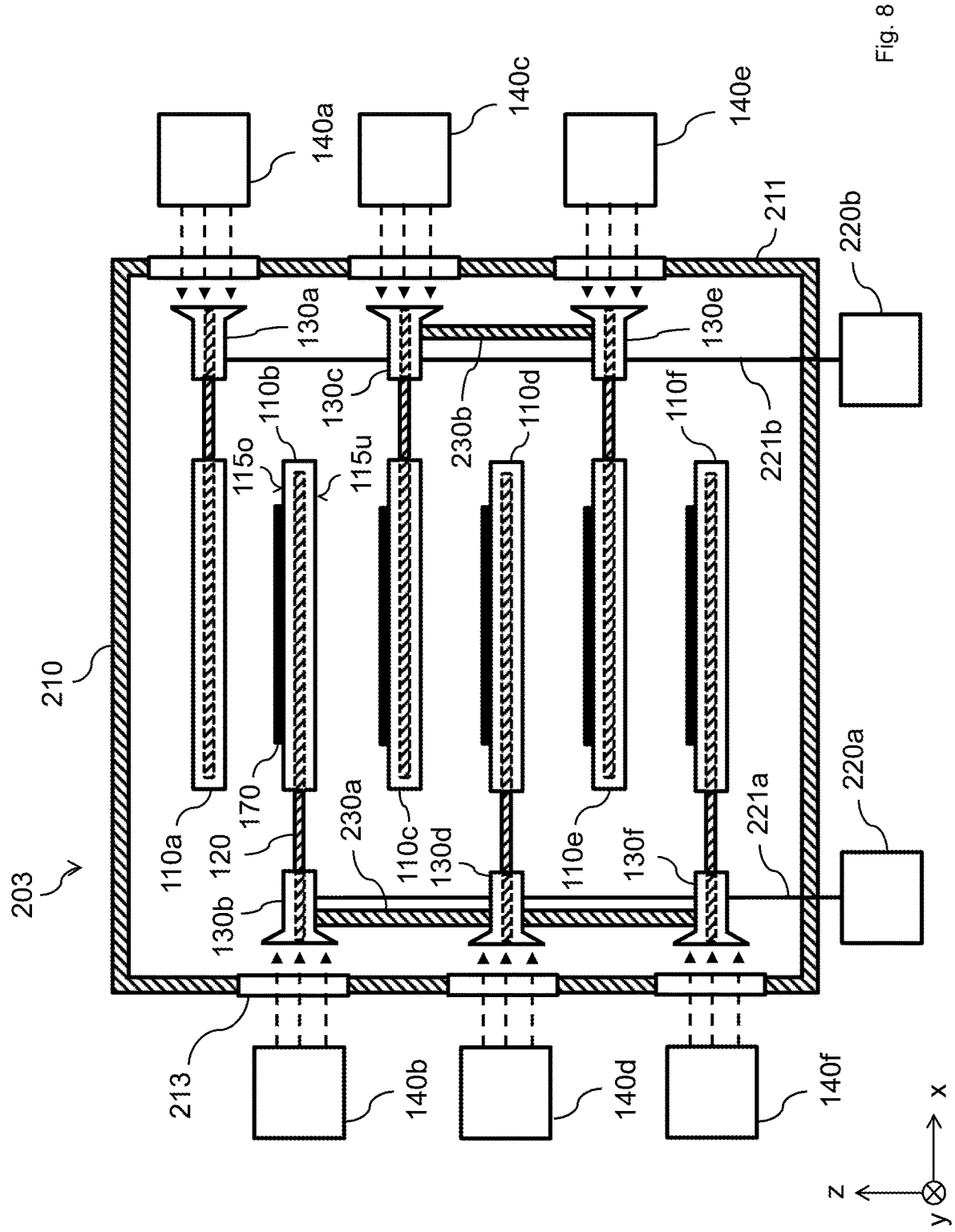
Figure 9:
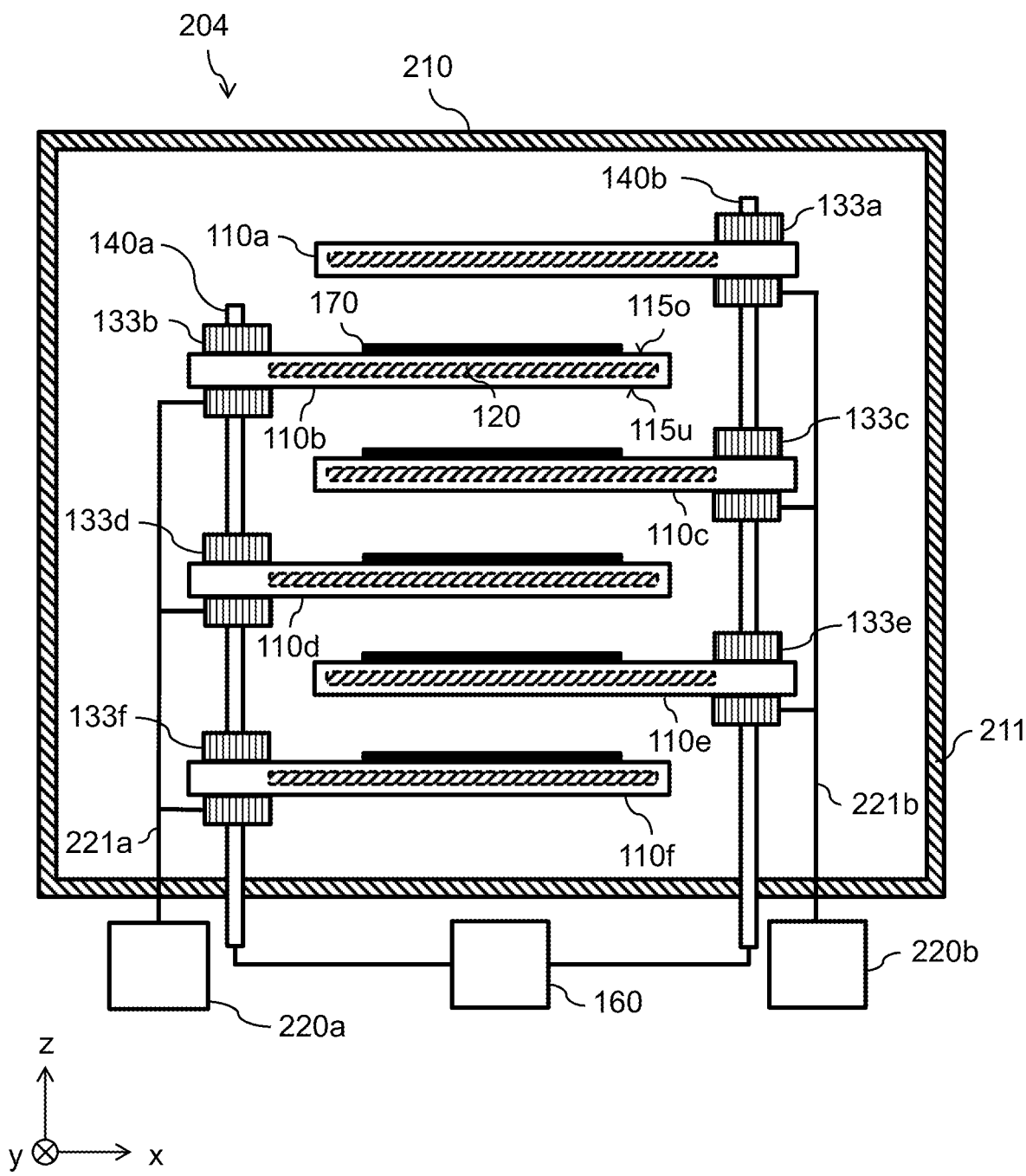

In the drawings:

FIG. 1A is a schematic view of a first example of the system according to the invention for temperature control of an electrode, in which the temperature control apparatus is spaced apart from the coupling element, FIG. 1B is a schematic view of a second example of the system according to the invention for temperature control of an electrode, in which the temperature control apparatus is physically connected to the coupling element, FIG. 2 is a perspective view of a portion of an example for the first embodiment of the system according to the invention for temperature control of an electrode, FIG. 3A is a perspective view of an example for the second embodiment of the system according to the invention for temperature control of an electrode, FIG. 3B is a cross section through the example from FIG. 3A at a first position, FIG. 3C is a cross section through the example from FIG. 3A at a second position, FIG. 4 is a perspective view of a portion of a first example for the third embodiment of the system according to the invention for temperature control of an electrode, FIG. 5A is a perspective view of a portion of a second example for the third embodiment of the system according to the invention for temperature control of an electrode, FIG. 5B is a perspective view only of a lower portion of the components shown in FIG. 5A, FIG. 6A is a schematic view of a first example of the treatment facility according to the invention, in which the coupling element of a system for temperature control of an electrode is arranged outside the treatment chamber, FIG. 6B is a schematic view of a second example of the treatment facility according to the invention, in which the coupling element of a system for temperature control of an electrode is arranged inside the treatment chamber and the temperature control apparatus is arranged outside the treatment chamber, FIG. 7 is a schematic view of a third example of the treatment facility according to the invention, in which a plurality of electrodes are arranged, FIG. 8 is a schematic view of a fourth example of the treatment facility according to the invention, which contains an electrode stack in which neighbouring coupling elements are arranged so as to be offset and some of the coupling elements at the same electrical potential are interconnected by means of an additional heat pipe, and FIG. 9 is a schematic view of a fifth example of the treatment facility according to the invention, which contains an electrode stack in which neighbouring coupling elements are arranged so as to be offset and the temperature of coupling elements at the same electrical potential is controlled by means of a common temperature control apparatus.

The basic structure of the system according to the invention for temperature control of an electrode 1 is shown with reference to FIGS. 1A and 1B, the thermal coupling between the temperature control apparatus and the coupling element being achieved by means of thermal radiation (FIG. 1A) or by means of heat conduction (FIG. 1B).

FIG. 1A shows a first example 100 of the system according to the invention. Said system contains at least one heat pipe 120 comprising a first end 121 and a second end 122, a coupling element 130, and a temperature control apparatus 140. In the example 100 shown, the first end 121 of the heat pipe 120 is arranged in the inside of the electrode 110, while the second end 122 of the heat pipe 120 is arranged in the coupling element 130. The heat pipe 120 extends such that the longitudinal extension thereof (between the first and the second end of the heat pipe) is in parallel with an effective surface 115 of the electrode 110 at least in part, on which effective surface for example a substrate 170 is arranged and retained or mounted. It is also possible for a plurality of substrates to be arranged and retained or mounted on the effective surface 115 of the electrode 110. In the case shown, the effective surface 115 extends in an x-y plane. In the case shown, the heat pipe 120 extends over its entire longitudinal extension in parallel with the effective surface 115, for example as a straight heat pipe in the x-direction. The coupling element 130 comprises a blackened heat transfer surface 136 which has a thermal absorption coefficient that is increased compared with other regions of the coupling element 130, and which has a surface which is enlarged compared with an outer surface of the coupling element 130 that is opposite the heat transfer surface 136, and compared with an outer surface of the electrode 110 that is opposite the coupling element 130. To this end, in the case shown, the extension of the heat transfer surface 136 in the z-direction is increased. The heat transfer surface 136 is thus particularly well suited for absorbing thermal radiation (indicated in FIG. 1A by the dashed arrows) which emanates from the temperature control apparatus 140, in this case an infrared radiator 141. The second end 122 of the heat pipe 120 does not adjoin the heat transfer surface 136 but in other embodiments may, however, also adjoin the heat transfer surface.

The temperature control apparatus 140 may also be an inductor which heats the coupling element 130 by means of induced eddy currents. In this case, the coupling element does not comprise a separate heat transfer surface.

In the first example 100 of the system according to the invention, the coupling element 130 is a body that is independent of the electrode 110 and is spaced apart therefrom, the distance between the opposing outer surfaces of the electrode 110 and of the coupling element 130 being shown in FIG. 1A as the spacing $d_1$. The spacing $d_1$ is in the range of from 0 mm to 100 mm, the spacing $d_1$ being limited by the maximum length of the heat pipe or heat pipes 120. In the case of small diameters of currently available heat pipes 120, the maximum length is approximately 1 m. However, the coupling element may also be formed as the outer surface of the electrode, as will be explained in more detail with reference to FIG. 2. Furthermore, the coupling element 130 and the temperature control apparatus 140 are likewise arranged at a spacing $d_2$ from one another, air and/or a vacuum being located between the coupling element 130 and the temperature control apparatus 140. The spacing $d_2$ is in the range of from 1 mm to 50 mm. In this case, the minimum value of the spacing $d_2$ is determined primarily by the size of the heat transfer surface 136, because a small capacitive coupling between the temperature control apparatus 140 and the coupling element 130 in the range of a few pF is intended to be ensured. In contrast, the maximum value of the spacing $d_2$ depends primarily on the focusability and/or performance of the temperature control apparatus 140 and may therefore also be greater than the value specified. As a result, the heat pipe 120 and/or the coupling element 130 may be electrically conductive or electrically insulating.

The first example 100 of the system according to the invention further comprises a temperature measurement unit 150 and a control unit 160. The temperature measurement unit 150 measures the temperature of the coupling element 130 or other parameters which allow for conclusions to be drawn regarding the temperature of the coupling element 130, and transmits the measured parameter or parameters or the temperature determined therefrom to the control unit 160 in a wired or wireless manner. In the case shown, the temperature measurement unit 150 is designed as a pyrometer 151 which determines the temperature of the coupling element 130 by means of the radiation emitted via the heat transfer surface 136. The control unit 160 controls the temperature control apparatus 140, via a control line 161 which may also be a wireless connection, in such a way that a desired temperature of the coupling element 130 is achieved.

The second example 101 of the system according to the invention, which is shown in FIG. 1B, differs from the first example 100 from FIG. 1A by the following points:

The coupling element 130 now comprises a highly thermally conductive heat transfer surface 137 instead of the blackened heat transfer surface of the first example 100.

The temperature control apparatus 140 is a resistive heater 142 (or a fluid-based temperature control apparatus), and is physically connected to the heat transfer surface 137 of the coupling element 130 by means of an electrical insulator 143. The electrical insulator 143 may for example consist of a ceramic oxide, e.g. $Al_2O_3$, or a non-oxide ceramic, e.g. AlN. If the heat pipe 120 and/or the coupling element 130 is/are electrically insulating, the electrical insulator 143 can also be omitted and the temperature control apparatus 140 can directly adjoin the heat transfer surface 137 of the coupling element 130. The electrical insulator 143 also has a high thermal conductivity of greater than or equal to 20 W/(m·K), but preferably over 150 W/(m·K).

The temperature measurement unit 150 consists of a thermocouple 152 which is arranged on a surface of the coupling element 130, said thermocouple optionally being electrically decoupled from the coupling element 130 by means of an insulator. The thermocouple 152 measures a parameter that is associated with the temperature of the coupling element 130, and transmits said parameter or the determined temperature to the control unit 160 in a wired or wireless manner.

FIG. 2 is a perspective view of a portion of an example 102 for the first embodiment of the system according to the invention for temperature control of an electrode 111. The electrode 111 contains five heat pipes 120a to 120e and comprises an effective surface 115 and a lateral surface 116. The lateral surface 116 at the same time forms the coupling element 131 of the first embodiment 102. The temperature control apparatus and further elements of the system according to the invention are not shown in FIG. 2.

The coupling element 131 is formed as a blackened heat transfer surface 136. The second ends 122 of the heat pipes 120a to 120e all adjoin the lateral surface 116 of the electrode 111, while the first ends 121 of the heat pipes 120a to 120e are arranged close to the lateral surface of the electrode 111 opposite the lateral surface 116, but do not adjoin said lateral surface. The heat pipes 120a to 120e are formed as straight pipes having an oval cross section, and extend inside the electrode 111 so as to be in parallel with the effective surface 115. Since said pipes are not visible from the outside, the contour thereof is shown only by dashed lines in FIG. 2. Of course, the heat pipes may also have different cross sections, for example circular or planar. Furthermore, the heat pipes may also have irregular cross sections or locally different cross sections, if they are slightly flattened or deformed for example during installation in the electrode.

An example 103 for the second embodiment of the system according to the invention for temperature control of an electrode 112 will be explained with reference to FIG. 3A to 3C. In this case, FIG. 3A is a schematic perspective view of the system 103, while FIGS. 3B and 3C are schematic cross sections through the system 103 from FIG. 3A, at the positions Y1 and Y2, respectively.

The system 103 contains heat pipes 1201 and 1202 which are arranged in the electrode 112, and a coupling element 132 which is a body that is independent of the electrode 112 and is not directly connected to the heat pipes 1201 and 1202. The coupling element 132 consists of an upper part 132o, which adjoins the upper effective surface 115o of the electrode 112, and a lower part 132u, which adjoins the lower effective surface 115u of the electrode 112. In this case, a substrate 170 can be arranged and retained on the upper effective surface 115o, in a region in which the coupling element 132 is not arranged, as is shown in FIG. 3A to 3C. In the example shown of the system 103, the lower effective surface 115u is not used, but may also contain for example a gas sparger for supplying a process gas into a process space that is arranged underneath the lower effective surface 115u, in the z-direction. Of course, the coupling element 132 can, however, only be arranged on one of the surfaces of the electrode 112, i.e. can only consist of the upper part 132o for example.

The system 103 furthermore contains a temperature control apparatus 140 which, in the example shown, is an infrared radiator 141 that is arranged in a cladding tube 144 for example made of silica glass. The cladding tube 144 may contain an atmosphere that is different from a process atmosphere generated during treatment of the substrate 170. For example, the atmosphere in the cladding tube 144 may be air at normal pressure ($10^5$ Pa), while the process atmosphere is a mixture of silane ($SiH_4$) and hydrogen ($H_2$) at a pressure of 100 Pa. The advantage of this is that the infrared radiator 141 is shielded from the process atmosphere and operation at ideal environmental conditions is possible. In this case, the infrared radiator 141 may be uniform over the entire length thereof (in the z-direction in the drawings), or may comprise different regions along the length thereof, the different regions emitting different amounts of heat.

The temperature control apparatus 140 is arranged in an opening 145 of the coupling element 132 and in an opening 117 of the electrode 112. In this case, the two openings 145 and 117 extend through the entire coupling element 132 and the entire electrode 112, respectively, such that the temperature control apparatus 140 protrudes both from the upper part 132o of the coupling element 132 and from the lower part 132u of the coupling element 132. However, the temperature control apparatus 140 may for example also end inside the coupling element 132, for example inside the upper part 132o, with the result that the opening 145 of the coupling element 132 does not reach as far as the surface of the upper part 132o. The cladding tube 144 has for example a circular cross section having a diameter of 32 mm. The cladding tube 144 is spaced apart from the coupling element 132 and the electrode 112 by a gap having a width of for example 0.5 mm to 5 mm, in order to allow for thermal expansion of the cladding tube 144, the coupling element 132 and the electrode 112. The inner surfaces of the opening 145 of the coupling element 132, which surfaces are the outer surfaces of the coupling element 132, form the heat transfer surface of the coupling element 132 and may be formed as a blackened heat transfer surface 136 for example, in order to absorb the thermal radiation particularly effectively. That is to say that the heat transfer surface 136 has an increased absorbing capacity compared with other regions of the coupling element 132. The coupling element 132 consists for example of aluminium, but may also consist of an electrically non-conductive material.

The heat pipes 1201 and 1202 are arranged inside the electrode 112, both ends of the heat pipes 1201 and 1202 being located inside the electrode 112. The heat pipe or heat pipes 1201 are arranged in the y-direction in a region of the electrode 112 in which the opening 117 is also formed in the electrode 112, as is shown in FIG. 3B. In contrast, the heat pipes 1202 are arranged in the y-direction in regions of the electrode 112 in which no opening 117 is formed in the electrode 112, as is shown in FIG. 3C. The length of the heat pipe or heat pipes 1201 in the x-direction is less than that of the heat pipes 1202. The heat pipes 1201 and 1202 are completely spaced apart from the coupling element 132, i.e. they neither adjoin said element and nor is an end of the heat pipes 1201 and 1202 arranged inside the coupling element 132. As a result, the amount of heat is transferred from the temperature control apparatus 140 to the heat pipes 1201 and 1202 or vice versa via the material of the electrode 112, the temperature control apparatus 140 controlling the temperature of the electrode 112 both directly and also indirectly via the coupling element 132. In this case, the heat transfer from the coupling element 132 to the electrode 112 is significantly greater that the heat transfer from the temperature control apparatus 140 directly to the electrode 112, as a result of the larger coupling surface (boundary surface between the coupling element 132 and the electrode 112) and the better thermal conductivity of the coupling element 132 compared with the electrode 112. Overall, the coupling element 132 extends over a substantially greater length along the temperature control apparatus 140 (in the z-direction) than the electrode 112. For example, the sum of the thicknesses of the upper part 132o and of the lower part 132u of the coupling element 132 in the z-direction is 38 mm, while the electrode 112 has a thickness of only 12 mm in the z-direction. The coupling surface between the coupling element 132 and the electrode 112 in an x-y plane is for example 100 $cm^2$, which corresponds for example to less than 15% of the effective surface of the electrode 112.

Of course, more than one temperature control apparatus 140 may be arranged in openings 145 and 117, for example two or three temperature control apparatuses, it also being possible for said temperature control apparatuses to transfer different amounts of heat to the coupling element 132. Furthermore, it is also possible for the temperature control apparatus 140 to be a resistive heater or a fluid-based apparatus, corresponding electrical insulation being provided between the electrode 112 and the temperature control apparatus 140, and optionally also between the coupling element 132 and the temperature control apparatus 140. Furthermore, the coupling element 132 may also comprise further elements, for example a gas supply means or an electrical connection for supplying a potential to the electrode 112.

FIG. 4 shows a portion of a first example 104 for the third embodiment of the system according to the invention for temperature control of an electrode 113, the temperature control apparatus not being shown. The third embodiment of the system according to the invention is also characterised in that a coupling element is formed as an independent body. In the first example 104, the coupling element 133 adjoins a lateral surface 116 of the electrode 113. FIG. 4 shows just a lower part of the electrode 113 and of the coupling element 133 in each case, in which parts heat pipes 120f to 120k are arranged. By way of example, the first end 121 and the second end 122 are denoted for the heat pipe 120k. All the heat pipes 120f to 120k are formed as bent pipes having a circular cross section, which pipes extend initially in the x-direction from the coupling element 133 into the electrode 113, and then extend further in the y-direction. This bend allows for the temperature of the heat pipes 120f to 120k to control the temperature of the electrode 113 uniformly over the entire extension thereof along the x-y plane, while at the same time the coupling element 133 has a substantially smaller extension with respect to the y-direction than the electrode 113. In order to achieve good thermal coupling of a temperature control apparatus, the coupling element 133 comprises a heat transfer surface 135 which may for example be a blackened heat transfer surface or a highly thermally conductive heat transfer surface, as has been explained with reference to FIGS. 1A and 1B. The heat transfer surface 135 has a greater extension in the z-direction than the lateral surface 116 of the electrode 113.

As already mentioned, FIG. 4 shows only a lower part of the electrode 113 and a lower part of the coupling element 133, in which parts the heat pipes 120f to 120k are arranged in depressions provided therefor in the electrode 113 or in the coupling element 133. In this case, the depressions are preferably dimensioned such that the heat pipes 120f to 120k are received almost entirely in the lower part of the electrode 113 or in the lower part of the coupling element 133. The depressions for the heat pipes 120f to 120k are thus for example slightly less deep than the height of the heat pipes, such that the heat pipes are slightly compressed when the upper parts of the electrode 113 or of the coupling element 133 are installed on the lower parts of the electrode 113 or of the coupling element 133. As a result, very good thermal contact can be achieved between the heat pipes 120f to 120k and the electrode 113 or the coupling element 133 without further aids, such as solder or heat pastes. It is also possible, however, for about half of the extension of the heat pipes 120f to 120k in the z-direction to be received by the lower part of the electrode 113 or the lower part of the coupling element 133. The upper parts of the electrode 113 or of the coupling element 133 then also comprise corresponding depressions, such that the heat pipes 120f to 120k are completely surrounded by the material of the electrode 113 or of the coupling element 133 after the relevant upper and lower parts of the electrode 113 and of the coupling element 133 have been connected. In order to connect the upper and the lower parts of the electrode 113 or of the coupling element 133, the electrode 113 and the coupling element 133 comprise fastening holes 180 which may be through-holes or holes that end in the material of the electrode 113 or of the coupling element 133, and in which fastening means, such as screws, rivets or the like, can be inserted.

A retaining opening 190, for example for a movement apparatus for moving or retaining the electrode 113, is formed in the lower part of the electrode 113, while an outer surface of the upper part of the electrode 113, which extends in an x-y plane, is used for receiving and retaining a substrate.

FIGS. 5A and 5B are perspective views of a portion of a second example 105 for the third embodiment of the system according to the invention, FIG. 5B showing only the lower portion of the components shown in FIG. 5A. The temperature control apparatus and optionally further components of the system according to the invention are not shown.

The electrode 114 and the coupling element 134 again each consist of an upper part 114o and 134o, respectively, and a lower part 114u and 134u, respectively, which parts each comprise depressions in which heat pipes 120l to 120q are arranged. In contrast to the first example 104 shown in FIG. 4, the heat pipes 120l to 120q extend in a straight line in the x-direction and do not have any bends. Furthermore, the coupling element 134 extends over the entire extension of the lateral surface 116 of the electrode 114, in the y-direction, such that the coupling element 134 and the electrode 114 have the same extension in the y-direction, and said coupling element 134 is spaced apart from the lateral surface 116. The heat pipes 120l to 120q are uniformly distributed over the extension of the electrode 114 and of the coupling element 134, in the y-direction. However, other distributions may also be advantageous, in order to compensate for possibly significant heat emission of the electrode 114 at the lateral surfaces thereof or to achieve other specific heat distributions over the extension of the electrode 114. The coupling element 134 again comprises a heat transfer surface 135 which is larger in the z-direction than the lateral surface 116 of the electrode 114.

FIG. 5A shows the electrode 114 and the coupling element 134 when in use, the upper and the lower parts 114o and 114u, and 134o and 134u, respectively, being rigidly but releasably interconnected by fastening means 181 (for example screws) which are inserted into fastening holes 180 (shown in FIG. 5B). In contrast, FIG. 5B merely shows the lower part 114u of the electrode 114 together with the lower part 116u of the lateral surface 116, and the lower part 134u of the coupling element 134 together with the lower part 135u of the heat transfer surface 135.

Furthermore, it can be seen in FIG. 5A that a depression 118 for receiving a substrate retainer or a substrate is formed in the effective surface 115 of the electrode 114.

Moreover, it is also possible to guide the temperature control apparatus 140 through an opening in the coupling element 133 or 134, as has been explained with reference to FIG. 3A to 3C, and to thus control the temperature of the coupling element 133 or 134 "from the inside out".

Although hitherto precisely one coupling element for one electrode has been shown in the drawings, it is also possible to use a plurality of coupling elements together with the associated heat pipes for temperature control of one electrode. In other words: It is also possible to use a plurality of systems for temperature control of an electrode in one electrode, it being possible for example for the temperature control apparatus of one or all of the plurality of systems to also be a common temperature control apparatus. In the latter case, different embodiments of the coupling elements or of the heat pipes can introduce different amounts of heat into different regions of the electrode. A plurality of systems for temperature control of an electrode may for example be used for temperature control of just one electrode if the temperature of different regions of the electrode is intended to be controlled differently. In general, however, the high thermal conductivity of most electrode materials ensures uniform temperature control of all regions of the electrode, even in the case of barely different heat input.

FIG. 6A is a schematic view of a first example 200 of the treatment facility according to the invention. The treatment facility 200 comprises a treatment chamber 210 in which at least one electrode 110 is arranged. The electrode 110 is heated or cooled by means of a temperature control system according to the invention. For this purpose, the temperature control system comprises at least one heat pipe 120, a coupling element 130, and a temperature control apparatus 140, as has been described with reference to FIG. 1B. A temperature measurement unit 150 and a control unit 160 are also provided. In the first example 200, the coupling element 130 and the temperature control apparatus 140 are arranged outside the treatment chamber 210. Therefore, a wall 211 of the treatment chamber 210, which defines the interior of the treatment chamber 210 with respect to the surroundings thereof, comprises a feedthrough 212 for the heat pipe 120, ensuring thermal isolation of the heat pipe 120 from the wall 211 and optionally also electrical isolation of the heat pipe 120 from the wall 211. A substrate 170 which does not belong to the treatment facility 200 is arranged on the effective surface 115 of the electrode 110 and can be treated by means of a process carried out in the treatment chamber 210. For this purpose, a specified electrode voltage may be applied to the electrode 110 by means of an electrical voltage supply 220, via an electrical cable 221. The voltage can also be transmitted in a contactless manner. Further elements of the treatment facility 200, such as vacuum pumps and gas supply lines, are not shown here.

The first example 200 shown in FIG. 6A makes it possible to use a temperature control apparatus 140 which achieves heat input into the coupling element 130 by means of heat conduction, for example the resistive heater 142 (as shown) or a fluid-based temperature control apparatus. In this case, the effects of a leak of the fluid-based temperature control apparatus can be reduced due to the temperature control apparatus being relocated out of the treatment chamber 210. It is of course also possible, however, to use a radiation source as the temperature control apparatus.

FIG. 6B is a schematic view of a second example 201 of the treatment facility according to the invention. In this case, the treatment facility 201 in principle comprises the same components as the treatment facility 200, specifically an electrode 110, a heat pipe 120, a coupling element 130, a temperature control apparatus 140, a temperature measurement unit 150, a control unit 160, a treatment chamber 210 comprising a wall 211, an electrical voltage supply 220, and an electrical cable 221. In this case, however, the coupling element 130 is arranged inside the treatment chamber 210, while the temperature control apparatus 140 is again arranged outside the treatment chamber 210. This is suitable in particular for the use of an infrared radiator 141 (as shown) or an inductive device as the temperature control apparatus 140, as is described with reference to FIG. 1A. A radiation window 213, e.g. consisting of silica glass, is arranged in the wall 211 of the treatment chamber 210, in the radiation path between the temperature control apparatus 140 and the coupling element 130.

FIG. 7 is a schematic view of a third example 202 of the treatment facility according to the invention, in which a plurality of electrodes are arranged in the treatment chamber. In the example 202, two electrodes 110a and 110b are arranged in the treatment chamber 210, the effective surfaces 115a and 115b of the electrodes 110a and 110b being arranged so as to be mutually parallel and mutually opposing. As a result, the two electrodes 110a and 110b form a plate capacitor which allows for example for the ignition of a plasma between the electrodes 110a and 110b when corresponding potentials are applied. For this purpose, the electrodes 110a and 110b are each connected to a separate electrical voltage supply 220a and 220b, respectively, by means of separate electrical cables 221a and 221b in each case. Of course, it is possible for different potentials to be applied to the two electrodes 110a and 110b by means of just one electrical voltage supply.

In this case, as shown in FIG. 7, just one electrode, for example the electrode 110b, may retain one or more substrates, while the other electrode, for example the electrode 110a, is used only for generating a specified electrical field. However, it is also possible for both electrodes to retain one or more substrates or for one or both electrodes to carry out further functions, such as the function of a gas supply means.

Each electrode 110a and 110b is heated or cooled by means of a separate system for temperature control of the relevant electrode. For this purpose, a first heat pipe 120a transfers a first amount of heat between a first coupling element 130a and the first electrode 110a, the first coupling element 130a being heated to a first temperature by means of a first temperature control apparatus 140a, for example a first resistive heater 142a, that is connected to the first coupling element 130a by means of a first electrical insulator 143a. A second heat pipe 120b transfers a second amount of heat between a second coupling element 130b and the second electrode 110b, the second coupling element 130b being heated to a second temperature by means of a second temperature control apparatus 140b, for example a second resistive heater 142b, that is connected to the second coupling element 130b by means of a second electrical insulator 143b. As a result, different or identical first or second temperatures of the coupling element 130a and 130b, and thus also of the electrodes 110a and 110b, can be set. Of course, a plurality of heat pipes may also be used for transferring the heat between the relevant coupling element and the relevant electrode, it being possible for the number of heat pipes, the design and/or arrangement thereof, to be the same or different for the different systems for temperature control of an electrode.

The coupling elements 130a and 130b, and the temperature control apparatuses 140a and 140b are arranged, by way of example, outside the treatment chamber 210, as has been explained with reference to FIG. 6A. As a result the treatment chamber 210 also comprises two feedthroughs 212a and 212b for the heat pipes 120a and 120b, respectively. Temperature control apparatuses 140a and 140b of the same type are shown by way of example, although it is also possible to use different temperature control apparatuses for each of the electrodes present, or a common temperature control apparatus for a plurality of electrodes.

FIG. 8 is a schematic view of a fourth example 203 of the treatment facility according to the invention. In this case, an electrode stack consisting of a plurality of electrodes 110a to 110f arranged above one another is arranged in the treatment chamber 210, the effective surfaces of the relevant electrodes 110a to 110f extending so as to be mutually parallel in different x-y planes that are arranged in the z-direction. In this case, the outer electrodes 110a and 110f of the electrode stack comprise just one effective surface in each case, which surfaces face the neighbouring electrode, i.e. the electrode 110b and the electrode 110e, respectively. The inner electrodes 110b to 110e comprise two opposing effective surfaces in each case, which surfaces in each case face an effective surface of a neighbouring electrode. By way of example, an upper effective surface 115o and a lower effective surface 115u have been denoted in FIG. 8 for the electrode 110b, the upper effective surface 115o facing the effective surface of the electrode 110a, while the lower effective surface 115u faces the upper effective surface of the electrode 110c. Of course, the number of electrodes in the electrode stack can be selected freely and is not limited to the number shown of six electrodes. For example, electrode stacks of 20, 50 or even 100 electrodes stacked one above the other are known, it also being possible for a plurality of electrode stacks to be arranged laterally side-by-side.

Each electrode 110a to 110f is heated or cooled to a specified temperature by means of a separate system for temperature control of the relevant electrode. For this purpose, each of the electrodes 110a to 110f is connected to a coupling element 130a to 130f by means of at least one heat pipe 120, denoted by way of example for the electrode 110b. In the example 203, all the coupling elements 130a to 130f are arranged inside the treatment chamber 210 and are each heated by temperature control apparatuses 140a to 140f formed as infrared radiators. For this purpose, radiation windows 213 are arranged in the wall 211 of the treatment chamber 210, in each radiation path between a temperature control apparatus 140a to 140f and the coupling element 130a to 130f associated therewith, as has been explained with reference to FIG. 6B. In principle, it is also possible for one or more of the temperature control apparatuses 140a to 140f to be replaced by a common temperature control apparatus if the same temperature is intended to be achieved at each of the associated coupling elements.

In order to achieve uniformity of the temperatures over the electrode stack, i.e. in the z-direction, it is furthermore possible to use additional heat pipes that interconnect different coupling elements. Two additional heat pipes 230a and 230b are shown by way of example in FIG. 8. In this case, the heat pipe 230a interconnects the coupling elements 130b, 130d and 130f, while the heat pipe 230b interconnects the coupling elements 130c and 130e. The coupling element 130a is not connected to other coupling elements by the heat pipe 230b, because for example the temperature of the electrode 110a is intended to be controlled to a different temperature from the electrodes 110c and 110e. It is of course also possible, however, for said coupling element to be connected to the coupling elements 130c and 130e by means of the heat pipe 230b in the event of a correspondingly desired electrode temperature. Using two different additional heat pipes 230a and 230b is justified by the potential supply to the electrodes by means of the relevant coupling elements and heat pipes, and the spatial arrangement of said coupling elements and heat pipes. However, the arrangement of additional heat pipes may be differently designed in other embodiments of the potential supply and of the systems for temperature control of the electrodes.

Two neighbouring electrodes in each case form a plate capacitor, it being possible for different electrical potentials to be applied to neighbouring electrodes. In the example 203, the potential is applied by means of an electrical voltage supply to the coupling elements 130a to 130f, the coupling elements 130a to 130f and the heat pipes 120 being electrically conductive. For example, a first potential is applied to the electrodes 110b, 110d and 110f by means of the relevant coupling elements 130b, 130d and 130f and the relevant heat pipes 120, from an electrical voltage supply 220a, via an electrical cable 221a. A second potential is applied to the electrodes 110a, 110c and 110e by means of the relevant coupling elements 130a, 130c and 130e and the relevant heat pipes 120, from an electrical voltage supply 220b, via an electrical cable 221b, the second potential being different from the first potential. In the case of this alternating potential application, an electrical field is formed between two neighbouring electrodes in each case, which field is suitable for igniting a plasma for example.

In order to reduce the risk of the formation of parasitic plasmas, the coupling elements 130a to 130f of electrodes to which a different potential is applied are mutually offset. In the example 203 shown, all the coupling elements 130a, 130c and 130e that receive the same type of application are arranged on the right-hand side of the electrode stack, and all the coupling elements 130b, 130d and 130f that receive the same type of application but at a different potential are arranged on the left-hand side of the electrode stack. That is to say that the coupling elements that are associated with electrodes that receive different applied potentials are in each case mutually offset in the x-direction. This is advantageous in particular for coupling elements which extend over the entire extension of the relevant electrode in the y-direction, as is shown in FIGS. 5A and 5B. In the case of coupling elements that extend only over a portion of the extension of the relevant electrode in the y-direction, as is shown in FIG. 4, the coupling elements of all systems for temperature control of an electrode can be arranged on one side of the electrode stack, i.e. on one side in the x-direction, the coupling elements that are associated with electrodes that receive different potentials then preferably being offset in the y-direction however. Arranging all the coupling elements on one side of the electrode stack is advantageous in that all the coupling elements can optionally be heated or cooled by one temperature control apparatus.

If an additional heat pipe is provided and is electrically conductive, the additional heat pipe can thus also apply a potential to the coupling elements connected thereto and the associated electrodes.

FIG. 9 is a schematic view of a fifth example 204 of the treatment facility according to the invention, in which, similarly to the case of the fourth example 203 from FIG. 8, neighbouring coupling elements 133 in a stack of electrodes 110 arranged above one another are offset, and the temperature of the coupling elements 133 that have the same electrical potential is controlled by a common temperature control apparatus 140a or 140b. In this case, the system for temperature control of the electrodes described with reference to FIG. 3A to 3C is used. In other words: Each electrode 110a to 110f comprises heat pipes 120 in the inside thereof, the second ends of which heat pipes extend into a volume region of the relevant electrode 110 of which at least one of the outer surfaces adjoins the relevant coupling element 133a to 133f. In this case, the coupling elements 133 of neighbouring electrodes 110 that have a different electrical potential are arranged on opposing sides of the electrodes 110 with respect to the x-direction. The electrical potential is supplied to the electrodes 110a to 110f by means of the coupling elements 133a to 133f which are each connected to one voltage supply 220a or to one voltage supply 220b by means of electrical cables 221a and 221b, respectively. The coupling elements 133b, 133d and 133f that are at a first potential are connected by means of the first temperature control apparatus 140a which extends in the z-direction, the first temperature control apparatus 140a being guided through openings (holes) in the relevant coupling elements 133b, 133d and 133f and in the relevant electrodes 110b, 110d and 110f, and the temperature of said coupling elements is controlled by the first temperature control apparatus 140a. In the same way, the temperature of the coupling elements 133a, 133c and 133e that are at a second potential and through which the second temperature control apparatus 140b extends, is controlled by the second temperature control apparatus 140b. The second temperature control apparatus 140b also extends through corresponding openings in the electrodes 110a, 110c and 110e. The coupling elements 133 can each extend in the z-direction until close to the closest coupling elements 133 that are connected to the same temperature control apparatus 140a or 140b, such that almost the entire temperature control apparatus 140a or 140b extends inside the relevant coupling elements 133 or electrodes 110. The coupling elements 133 preferably do not directly adjoin one another, however, in order to be able to accommodate thermal expansion of the coupling elements 133 at increased temperatures. Alternatively, larger regions of the temperature control apparatuses 140a or 140b may also be located outside the coupling elements 133 and the electrodes 110, as is indicated in FIG. 9. In this case, it is preferably possible to use infrared radiators which emit a large amount of heat only in specific regions of the extension thereof, said regions then being surrounded by the coupling elements 133 and electrodes 110, while regions of the infrared radiator that generate only a little infrared radiation are arranged outside the coupling elements 133 and the electrodes 110. The temperature control apparatuses 140a and 140b are guided through the wall 211 of the treatment chamber 210 and are connected to a control unit 160 outside the treatment chamber 210.

This embodiment has the advantages of a very small space requirement within the treatment chamber 210, an air atmosphere for the infrared radiator that is sealed by the cladding tube, as has already been explained with reference to FIG. 3A to 3C, and only very few required vacuum feedthroughs through the wall 211 of the treatment chamber 210.

In addition to being used for supplying an electrical voltage, the coupling elements 133 can also be used for supplying a process gas in gas spargers which are in each case arranged on the lower effective surfaces 115u of the electrodes 110a to 110e for example. This is not shown here for reasons of clarity.

Some or all of the possibilities mentioned for the design of the system according to the invention for temperature control of an electrode, and the treatment facility according to the invention, can also be combined with one another, provided they are not mutually exclusive. Furthermore, it is possible to use different temperature control apparatuses and different numbers, designs and/or arrangements of heat pipes and coupling elements in different systems for temperature control of an electrode. The number of electrodes in a treatment facility and the number, design and/or arrangement of the coupling elements and of additional heat pipes is likewise not limited to the examples shown. The specified values for spacings and sizes are guideline values which can, however, also be exceeded or not met in the case of a suitable selection of the corresponding components.

LIST OF REFERENCE SIGNS

100-105 system for temperature control of an electrode
110-114, 110a-110f electrode
114o upper part of the electrode
114u lower part of the electrode
115 effective surface of the electrode
115o upper effective surface of the electrode
115u lower effective surface of the electrode
116 lateral surface of the electrode
116u lower part of the lateral surface
117 opening in the electrode
118 depression for substrate retainer
120, 120a-120q, heat pipe
120₁, 120₂
121 first end of the heat pipe
122 second end of the heat pipe
130-134, 130a-130f coupling element
132o, 134o upper part of the coupling element
132u, 134u lower part of the coupling element
135 heat transfer surface
135u lower part of the heat transfer surface
136 blackened heat transfer surface
137 highly thermally conductive heat transfer surface
140, 140a-140f temperature control apparatus
141 infrared radiator
142 resistive heater
143 electrical insulator
144 cladding tube
145 opening in the coupling element
150 temperature measurement unit
151 pyrometer
152 thermocouple
160 control unit
161 control line
170 substrate
180 fastening hole
181 fastening means
190 retaining opening
200-204 treatment facility
210 treatment chamber
211 wall of the treatment chamber
212 feedthrough for heat pipe
213 radiation window
220, 220a, 220b electrical voltage supply
221, 221a, 221b electrical cable
230a, 230b additional heat pipe
$d_1$ spacing between electrode and coupling element
$d_2$ spacing between coupling element and temperature control apparatus

The invention claimed is:

1. A system for temperature control of an electrode, comprising at least one heat pipe, a coupling element and a temperature control apparatus, wherein the heat pipe is suited for being arranged in the electrode at least in part and by means of at least one first end, the coupling element is suitable for heating or cooling a second end of the heat pipe, and the temperature control apparatus is suitable for heating or cooling the coupling element, wherein the electrode and the temperature control apparatus are electrically insulated from one another, wherein the coupling element and the temperature control apparatus are separated by a gap, and wherein the temperature control apparatus is an infrared radiator, an inductor, or a fluid-based apparatus.

2. The system according to claim 1, wherein the coupling element is a body that is separated from the electrode and consists of a material having a high level of thermal conductivity, and is arranged in a region of the outer surface of the electrode that is adjacent to a volume region of the electrode in which at least the second end of the heat pipe is suited for being arranged.

3. The system according to claim 2, wherein the coupling element consists of an electrical conductive material or an electrically insulating material.

4. The system according to claim 3, wherein the coupling element comprises a heat transfer surface that has an increased thermal absorption coefficient or an increased thermal conductivity compared with other regions of the coupling element.

5. The system according to claim 2, wherein the coupling element comprises a heat transfer surface that has an increased thermal absorption coefficient or an increased thermal conductivity compared with other regions of the coupling element.

6. The system according to claim 1, wherein the coupling element is a body that is separated from the electrode and consists of a material having a high level of thermal conductivity, and in which at least the second end of the heat pipe is arranged.

7. The system according to claim 6, wherein the coupling element consists of an electrical conductive material.

8. The system according to claim 6, wherein the coupling element consists of an electrically insulating material.

9. The system according to claim 6, wherein the coupling element comprises a heat transfer surface that has an increased thermal absorption coefficient or an increased thermal conductivity compared with other regions of the coupling element.

10. The system according to claim 1, wherein the system further contains a temperature measurement unit and a control unit, the temperature measurement unit being suitable for determining a parameter that is associated with the temperature of the coupling element, and the control unit being suitable for controlling the temperature control apparatus.

11. The system according to claim 1, wherein the gap is selected from a range of 0.5 mm to 5 mm.

12. A treatment facility comprising a treatment chamber and at least one electrode inside the treatment chamber, wherein the treatment facility further comprises at least one system according to claim 1 for temperature control of an electrode.

13. The treatment facility according to claim 12, wherein the temperature control apparatus of at least one first system for temperature control of an electrode is arranged outside the treatment chamber, and wherein the coupling element of the first system for temperature control of an electrode is arranged completely inside the treatment chamber, and the temperature control apparatus of the first system for temperature control of an electrode is an infrared radiator or an inductor.

14. The treatment facility according to claim 12, wherein the treatment facility comprises a plurality of electrodes and a plurality of systems for temperature control of an electrode, the coupling elements of at least two systems for temperature control of an electrode being interconnected by means of at least one additional heat pipe.

15. The treatment facility according to claim 12, wherein
the treatment facility comprises a plurality of electrodes inside the treatment chamber, the effective surfaces of which electrodes are in each case mutually parallel and mutually opposing, and adjacent electrodes being connected to one or more voltage supplies, such that different electrode voltages can be applied to said electrodes,
wherein the coupling element is a body that is separated from the electrode and consists of a material having a high level of thermal conductivity, and in which at least the second end of the heat pipe is arranged, in which the coupling element has the same potential, at at least one of the outer surfaces thereof, as the associated electrode, and
the coupling elements of systems for temperature control of an electrode, which coupling elements are associated with neighbouring electrodes, are arranged so as to be mutually offset at least in a direction perpendicular to the spacing of the neighbouring electrodes.

16. The treatment facility according to claim 12, wherein the coupling element of at least one system for temperature control of an electrode is connected to a voltage supply and is suitable, alone or together with the relevant at least one heat pipe, for applying an electrode voltage to the associated electrode.

17. A system for temperature control of an electrode, comprising at least one heat pipe, a coupling element and a temperature control apparatus, wherein the heat pipe is suited for being arranged in the electrode at least in part and by means of at least one first end, wherein the electrode includes at least one recess for removably inserting at least a portion of the at least one heat pipe, the coupling element is suitable for heating or cooling a second end of the heat pipe, and the temperature control apparatus is suitable for heating or cooling the coupling element, wherein the electrode and the temperature control apparatus are electrically insulated from one another, wherein the coupling element has a first surface, the temperature control apparatus has a second surface, the first surface is positioned facing the second surface, and the first surface is spaced from the second surface such that a gap exists between the first surface and the second surface.

18. The system according to claim 17, wherein the electrode has a third surface, the third surface is positioned facing the second surface and the third surface is spaced from the second surface such that a gap exists between the third surface and the second surface.

19. A system for temperature control of an electrode, comprising at least one heat pipe, a coupling element and a temperature control apparatus, wherein the heat pipe is suited for being arranged in the electrode at least in part and by means of at least one first end, the coupling element is suitable for heating or cooling a second end of the heat pipe, and the temperature control apparatus is suitable for heating or cooling the coupling element, wherein the electrode and the temperature control apparatus are electrically insulated from one another, and wherein the temperature control apparatus is spaced apart to form a gap from the coupling element and the electrode.

* * * * *